United States Patent
Dalla Longa et al.

(10) Patent No.: US 11,817,874 B1
(45) Date of Patent: Nov. 14, 2023

(54) LINEAR MULTI-LEVEL DAC

(71) Applicant: Infineon Technologies AG, Neubiberg (DE)

(72) Inventors: Matteo Dalla Longa, Villach (AT); Francesco Conzatti, Villach (AT); Tobias Hofmann, Ehingen (DE); John G. Kauffman, Neu-Ulm (DE); Maurits Ortmanns, Ulm (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/804,675

(22) Filed: May 31, 2022

(51) Int. Cl.
| | | |
|---|---|---|
| *H03M 1/66* | (2006.01) | |
| *H03M 1/06* | (2006.01) | |
| *H03M 1/80* | (2006.01) | |

(52) U.S. Cl.
CPC ........... *H03M 1/0617* (2013.01); *H03M 1/66* (2013.01); *H03M 1/80* (2013.01)

(58) Field of Classification Search
CPC ....................................................... H03M 1/80
USPC .................................. 341/144, 172, 118, 143
See application file for complete search history.

(56) References Cited

U.S. PATENT DOCUMENTS

| | | | |
|---|---|---|---|
| 2014/0253354 A1* | 9/2014 | Quiquempoix | H03M 1/0665 341/150 |
| 2020/0169228 A1* | 5/2020 | Horii | H03M 3/342 |

OTHER PUBLICATIONS

Onga, Matteo Dalla et al., "A Highly Linear Calibration Free 13 Levels DAC for Delta Sigma Modulators", Journal of Latex Class Files, vol. 14, No. 8, Aug. 2021, 5 pages.
Zhang, Yang et al., "Highly Linear Multi-Level SC DAC in a Power-Efficient Gm-C Continuous-Time Delta-Sigma Modulator", IEEE Transactions on Circuits and Systems Regular Papers, vol. 66, No. 12, Dec. 2019, 14 pages.

* cited by examiner

*Primary Examiner* — Peguy Jean Pierre
(74) *Attorney, Agent, or Firm* — Slater Matsil, LLP

(57) ABSTRACT

In accordance with an embodiment, a method for digital-to-analog conversion includes: mapping a uniformly distributed input code to a non-uniformly distributed input code of a switched capacitor digital-to-analog converter (DAC), the non-uniformly distributed input code including a most significant code (MSC) and a least significant code (LSC); transferring a first charge from a set of DAC capacitors to a charge accumulator based on the MSC; forming a second charge based on the LSC; and transferring the second charge from the set of DAC capacitors to the charge accumulator, where each capacitor of the set of DAC capacitors is used for each value of the non-uniformly distributed input code, each capacitor of the set of DAC capacitors provides a same corresponding nominal charge within each value of the non-uniformly distributed input code, and where the same nominal charge is proportional to a value of the non-uniformly distributed input code.

22 Claims, 14 Drawing Sheets

VOLTAGES FOR THERMOMETRIC DAC

| Codes | +2 | +1 | 0 | -1 | -2 |
|---|---|---|---|---|---|
| $V_{A1}$ | $V_{SS}$ | $V_{SS}$ | $V_{SS}$ | $V_{DD}$ | $V_{DD}$ |
| $V_{A2}$ | $V_{DD}$ | $V_{DD}$ | $V_{SS}$ | $V_{SS}$ | $V_{SS}$ |
| $V_{B1}$ | $V_{SS}$ | $V_{SS}$ | $V_{SS}$ | $V_{SS}$ | $V_{DD}$ |
| $V_{B2}$ | $V_{DD}$ | $V_{SS}$ | $V_{SS}$ | $V_{SS}$ | $V_{SS}$ |

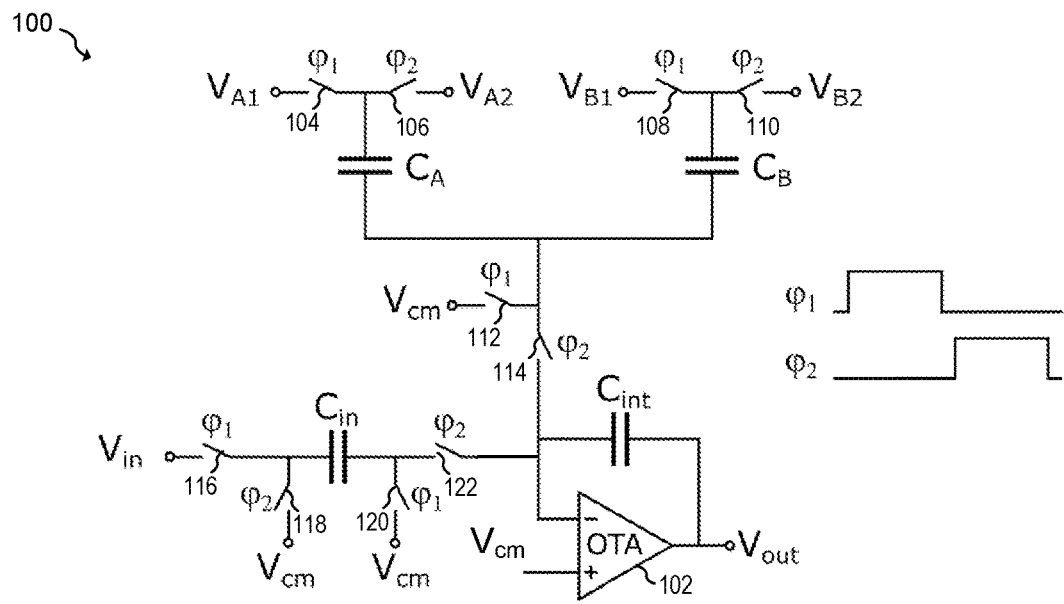
*FIG. 1A*
VOLTAGES FOR THERMOMETRIC DAC
| Codes | +2 | +1 | 0 | -1 | -2 |
|---|---|---|---|---|---|
| $V_{A1}$ | $V_{SS}$ | $V_{SS}$ | $V_{SS}$ | $V_{DD}$ | $V_{DD}$ |
| $V_{A2}$ | $V_{DD}$ | $V_{DD}$ | $V_{SS}$ | $V_{SS}$ | $V_{SS}$ |
| $V_{B1}$ | $V_{SS}$ | $V_{SS}$ | $V_{SS}$ | $V_{SS}$ | $V_{DD}$ |
| $V_{B2}$ | $V_{DD}$ | $V_{SS}$ | $V_{SS}$ | $V_{SS}$ | $V_{SS}$ |
*FIG. 1B*
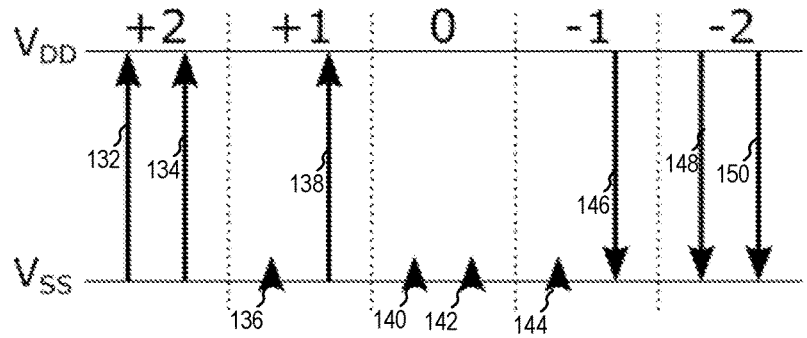
*FIG. 1C*

VOLTAGES FOR 5-LEVELS HIGHLY LINEAR DAC
| Codes | +2 | +1 | 0 | -1 | -2 |
|---|---|---|---|---|---|
| $V_{A1}$ | $V_{SS}$ | $V_{cm}$ | $V_{cm}$ | $V_{DD}$ | $V_{DD}$ |
| $V_{A2}$ | $V_{DD}$ | $V_{DD}$ | $V_{cm}$ | $V_{cm}$ | $V_{SS}$ |
| $V_{B1}$ | $V_{SS}$ | $V_{SS}$ | $V_{cm}$ | $V_{cm}$ | $V_{DD}$ |
| $V_{B2}$ | $V_{DD}$ | $V_{cm}$ | $V_{cm}$ | $V_{SS}$ | $V_{SS}$ |
*FIG. 1D*
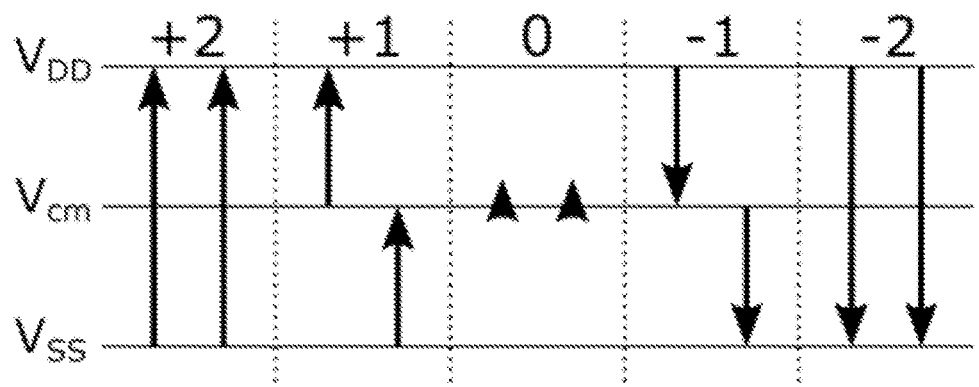
*FIG. 1E*
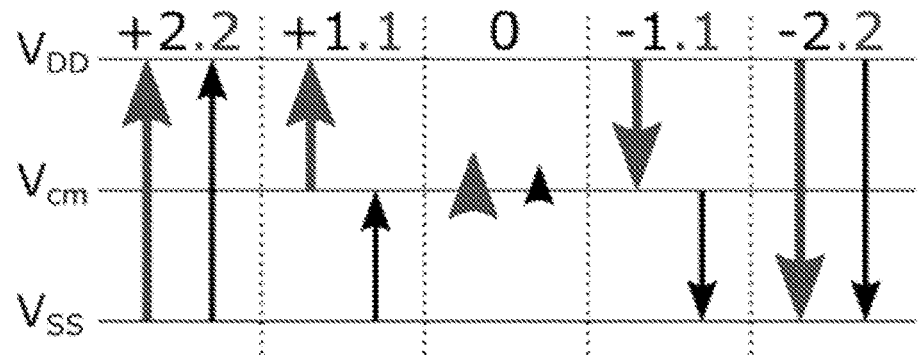
*FIG. 1F*

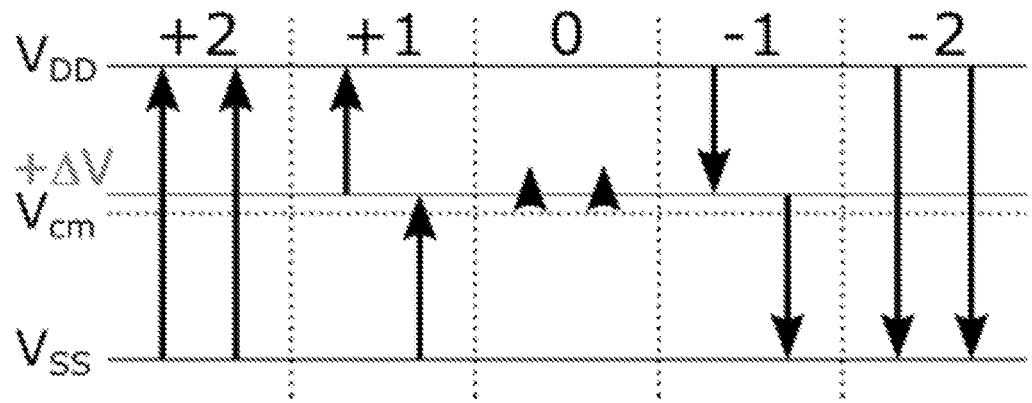
FIG. 1G
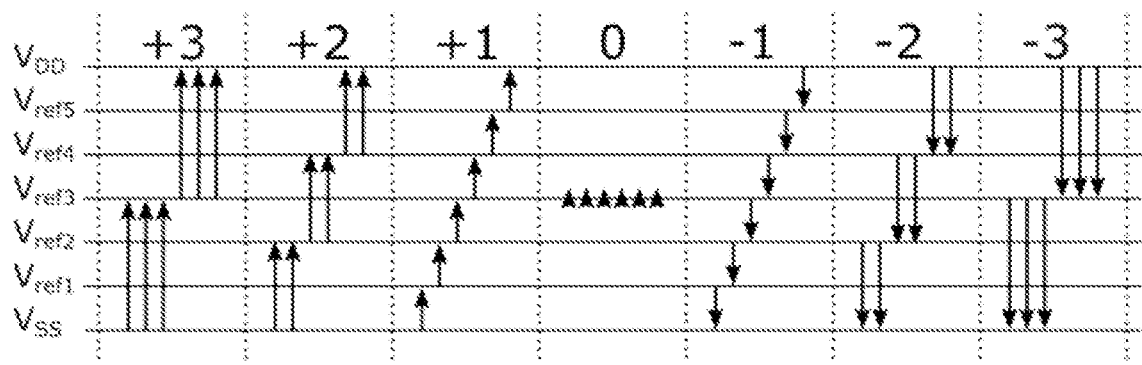
FIG. 1H
NUMBER OF CAPACITORS FOR A N-LEVELS HIGHLY LINEAR DAC
| $N_L$ | 5 | 7 | 9 | 11 | 13 | 15 |
|---|---|---|---|---|---|---|
| $N_C$ | 2 | 6 | 12 | 60 | 60 | 420 |
FIG. 1I

| Code | MSC | LSC |
|---|---|---|
| -6 | -4 | -2 |
| -5 | -4 | -1 |
| -4 | -4 | 0 |
| -3 | -4 | 1 |
| -2 | 0 | -2 |
| -1 | 0 | -1 |
| 0 | 0 | 0 |
| 1 | 0 | 1 |
| 2 | 0 | 2 |
| 3 | 4 | -1 |
| 4 | 4 | 0 |
| 5 | 4 | 1 |
| 6 | 4 | 2 |

| Code | $C_A$ | | $C_B$ | | $C_C$ | | $C_D$ | |
|---|---|---|---|---|---|---|---|---|
| | $\Phi_1/\Phi_3$ | $\Phi_2/\Phi_4$ | $\Phi_1/\Phi_3$ | $\Phi_2/\Phi_4$ | $\Phi_1/\Phi_3$ | $\Phi_2/\Phi_4$ | $\Phi_1/\Phi_3$ | $\Phi_2/\Phi_4$ |
| -4 | $V_{DD}$ | $V_{SS}$ | $V_{DD}$ | $V_{SS}$ | $V_{DD}$ | $V_{SS}$ | $V_{DD}$ | $V_{SS}$ |
| -3 | --- | --- | --- | --- | --- | --- | --- | --- |
| -2 | $V_{REF2}$ | $V_{SS}$ | $V_{REF2}$ | $V_{SS}$ | $V_{DD}$ | $V_{REF2}$ | $V_{DD}$ | $V_{REF2}$ |
| -1 | $V_{REF1}$ | $V_{SS}$ | $V_{REF2}$ | $V_{REF1}$ | $V_{REF3}$ | $V_{REF2}$ | $V_{DD}$ | $V_{REF3}$ |
| 0 | $V_{REF2}$ | $V_{REF2}$ | $V_{REF2}$ | $V_{REF2}$ | $V_{REF2}$ | $V_{REF2}$ | $V_{REF2}$ | $V_{REF2}$ |
| 1 | $V_{SS}$ | $V_{REF1}$ | $V_{REF1}$ | $V_{REF2}$ | $V_{REF2}$ | $V_{REF3}$ | $V_{REF3}$ | $V_{DD}$ |
| 2 | $V_{SS}$ | $V_{REF2}$ | $V_{SS}$ | $V_{REF2}$ | $V_{REF2}$ | $V_{DD}$ | $V_{REF2}$ | $V_{DD}$ |
| 3 | --- | --- | --- | --- | --- | --- | --- | --- |
| 4 | $V_{SS}$ | $V_{DD}$ | $V_{SS}$ | $V_{DD}$ | $V_{SS}$ | $V_{DD}$ | $V_{SS}$ | $V_{DD}$ |

*FIG. 3C*

LINEAR MULTI-LEVEL DAC

TECHNICAL FIELD

The present invention relates generally to a system and method for an electronic system, and, in particular embodiments, to a system and method for a linear multi-level digital-to-analog converter (DAC).

BACKGROUND

Sigma-delta analog-to-digital converters are commonly used in many electronic applications due to their good signal to noise and distortion ratio (SNDR) and their relaxed performance requirements on analog circuits. A sigma-delta ADC includes a sigma-delta modulator, which includes an integrator followed by a quantizer and a digital-to-analog converter (DAC) arranged in a feedback loop. The sigma-delta modulator is oversampled by a sufficiently high oversampling ratio, such that the quantization noise generated by the quantizer is pushed to higher out of band frequencies by the action of the feedback loop, which leaves a very high dynamic range for the in-band signal. In many applications, the higher frequency quantization noise is digitally filtered and the high sampling rate of the data output by the modulator is reduced using a decimation filter.

Many sigma-delta ADCs use a single-bit quantizer and a single-bit DAC. Since a single-bit DAC is inherently linear (e.g., two values of a single bit can represent a perfect line), a single-bit sigma-delta ADC can achieve very high levels of linearity. However, single-bit sigma-delta converters generally require a very high oversampling ratio (OSR) to achieve a given signal-to-noise ratio (SNR).

By using a multi-bit quantizer and a multi-bit DAC instead of a single-bit quantizer and a single-bit DAC, the OSR can be reduced. However, the linearity performance of the multi-bit sigma-delta ADC is limited by the linearity of the multi-bit DAC. In particular, mismatches in the electronic components used to form the analog output signal of the DAC contribute to the DAC's non-linearity. For example, capacitor mismatch in a multi-bit switched capacitor DAC may cause distortion in the sigma-delta modulator.

There are a number of techniques that have been used to improve the linearity of multi-bit DACs used in sigma-delta ADCs, such as foreground calibration, background calibration and dynamic element matching techniques. These techniques are generally achieved at the cost of additional circuit complexity.

SUMMARY

In accordance with an embodiment, a method for digital-to-analog conversion includes: mapping a uniformly distributed input code to a non-uniformly distributed input code of a switched capacitor digital-to-analog converter (DAC), the non-uniformly distributed input code including a most significant code (MSC) and a least significant code (LSC); transferring a first charge from a set of DAC capacitors to a charge accumulator based on the MSC; forming a second charge based on the LSC; and transferring the second charge from the set of DAC capacitors to the charge accumulator, where each capacitor of the set of DAC capacitors is used for each value of the non-uniformly distributed input code, each capacitor of the set of DAC capacitors provides a same corresponding nominal charge within each value of the non-uniformly distributed input code, where the same nominal charge is proportional to a value of the non-uniformly distributed input code, for a non-zero LSC, the second charge is formed using a plurality of subsets of the set of DAC capacitors and a corresponding plurality of pairs of reference voltages, where each pair of the plurality of pairs of reference voltages share one common reference voltage with an adjacent pair of the plurality of pairs of reference voltages, each of the plurality of subsets of the DAC capacitors is different from one another, and each of the plurality of pairs of reference voltages is different from one another, and a sum of the first transferred charge and the second transferred charge provides a uniformly distributed output value in accordance with the uniformly distributed input code.

In accordance with another embodiment, a digital-to-analog converter (DAC) includes: a set of capacitors; a charge accumulator coupled to the set of capacitors; a switching network coupled between the set of capacitors and a plurality of reference voltage nodes; a controller coupled to the switching network, the controller configured to: map a uniformly distributed input code to a non-uniformly distributed input code, the non-uniformly distributed input code including a most significant code (MSC) and a least significant code (LSC); cause the switching network to transfer a first charge from the set of capacitors to the charge accumulator based on the MSC; and cause the switching network to transfer a second charge from the set of capacitors to the charge accumulator based on the LSC, where each capacitor of the set of capacitors is used for each value of the non-uniformly distributed input code, each capacitor of the set of capacitors is configured to provide a same corresponding nominal charge within each value of the non-uniformly distributed input code, where the same nominal charge is proportional to the value of the non-uniformly distributed input code, for a non-zero LSC, the controller is configured to cause the switching network and the set of capacitors to form the second charge using a plurality of subsets of the set of capacitors and a corresponding plurality of pairs of reference voltages, where each pair of the plurality of pairs of reference voltages share one common reference voltage with an adjacent pair of the plurality of pairs of reference voltages, each of the plurality of subsets of the capacitors is different from one another, and each of the plurality of pairs of reference voltages is different from one another, and a sum of the first transferred charge and the second transferred charge provides a uniformly distributed output value in accordance with the uniformly distributed input code.

In accordance with a further embodiment, a sigma-delta analog-to-digital converter (ADC) includes: an integrator; a multi-bit quantizer coupled to an output of the integrator; a plurality of capacitors having first terminals coupled to an input of the integrator; a reference voltage generator including outputs configured to provide a plurality of evenly spaced reference voltages; a switching network coupled between the reference voltage generator and second terminals of the plurality of capacitors; and a controller configured to: map a uniformly distributed input code to a non-uniformly distributed input code, and successively couple the outputs of the reference voltage generator to the second terminal of each of the plurality of capacitors via the switching network according a respective value of the non-uniformly distributed input codes to apply a voltage difference, where each of the plurality of capacitors is used for each value of the non-uniformly distributed input code, the voltage difference applied to the second terminals of the plurality of capacitors is proportional to the value of the non-uniformly distributed input code, the voltage difference applied to the second terminals of the plurality of capacitors is substantially the same for each capacitor of the plurality of capacitors for a particular value of the non-uniformly distributed input code, for a non-zero LSC, the controller is configured to apply a first voltage difference formed by a first pair of outputs of the reference voltage generator to a first subset of the plurality of capacitors, and to apply a second voltage difference formed by a second pair of outputs of the reference voltage generator to a second subset of the plurality of capacitors different from the first subset, where the first pair of outputs are different from and share a common output with the with second pair of outputs.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates an exemplary DAC; FIG. 1B illustrates a table of applied voltages for the example DAC of FIG. 1A; FIG. 1C illustrates an arrow diagram associated with the exemplary DAC of FIG. 1A; FIG. 1D illustrates a further table of applied voltages for the exemplary DAC of FIG. 1A; FIGS. 1E, 1F, 1G and 1H illustrate further arrow diagrams associated with the exemplary DAC of FIG. 1A; and FIG. 1I illustrates a table detailing the number of DAC capacitors for a given number of DAC levels for the exemplary DAC of FIG. 1A;

FIG. 3C illustrates a table of applied voltages for the embodiment DAC of FIG. 3A;

Figures 2A, 2B:
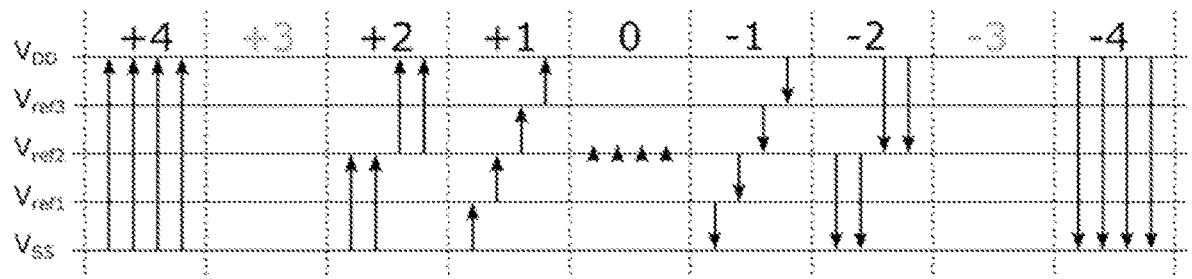
FIG. 2A illustrates an arrow diagram and FIG. 2B illustrates a decoding table according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In accordance with an embodiment, a highly linear DAC performance is achieved over multiple quantization levels using a capacitor array, a charge accumulator, and a plurality of reference voltages. The DAC core is implemented using switched capacitors and is arranged to have a non-uniformly distributed input code. The non-linear effects of capacitor mismatch and reference voltage variation is significantly reduced by using a switching scheme in which each capacitor of the DAC core is used for each value of the non-uniformly distributed input code, and each capacitor provides a same corresponding nominal charge within each value of the non-uniformly distributed input code. For non-maximum and non-zero input codes, charge provided by the switched capacitors is formed using a plurality of subsets of the set of DAC capacitors and a corresponding plurality of pairs of reference voltages, where each pair of the plurality of pairs of reference voltages share one common reference voltage with an adjacent pair of the plurality of pairs of reference voltages, each of the plurality of subsets of the DAC capacitors is different from one another, and each of the plurality of pairs of reference voltages is different from one another.

During operation, a uniformly distributed input code is mapped to a non-uniformly distributed input code that includes a most significant code (MSC) and a least significant code (LSC). The MSC and LSC are converted to the analog domain over a plurality of successive cycles to produce a uniformly distributed analog output value in accordance with the uniformly distributed input code.

Advantages of embodiments include the ability to compensate for random capacitor and reference voltage mismatches and asymmetry, and the ability to produce a higher number of highly linear output levels for a given number of capacitors and reference voltages compared to conventional DACs. Embodiment DACs can be implemented in a variety of data converter systems, such as sigma-delta modulators, pipeline ADCs, and successive approximation ADCs to provide improved linearity performance, power reduction, and area savings. For example, multi-bit sigma-delta modulators often suffer from reduced linearity performance due to DAC nonlinearities. By improving DAC linearity in accordance with the embodiments described herein, a sigma-delta modulator that uses an embodiment DAC can maintain both high linearity and good noise performance at lower oversampling rates than single-bit modulators. In some embodiments, high performance can be advantageously achieved without using dynamic element matching (DEM) techniques or calibration.

Sigma-delta modulators have been the architecture of choice for ADCs in many different applications, due to their good signal-to-noise-and-distortion ratio (SDNR) performance and relaxed requirements on the analog circuitry. When a high SNDR is required but the over-sampling ratio (OSR) is limited, modulators employing a multi-bit quantizer are used instead of their single-bit counterpart, and multi-bit DACs are therefore used in the feedback loop. A primary performance issue of multi-bit DACs stems from element mismatch that may limit the maximum achievable linearity of the DAC, which, in turn, limits the SNDR of the modulator. Various techniques have been developed to reduce the impact of element mismatch on the linearity. The most common are calibration (background or foreground, analog or digital) and error mismatch shaping (e.g., data-weighted averaging). In the technical paper, "A Highly Linear Multi-Level SC DAC in a Power-Efficient Gm-C Continuous-Time Delta-Sigma Modulator," by Y. Zhang, D. Basak and K. Pun (*IEEE Transactions on Circuits and Systems I: Regular Papers*, Vol. 66, No. 12, pp. 4592-4605, December 2019), the sensitivity of DAC linearity to capacitor mismatch is addressed by acting on the voltage at which the capacitors are charged, rather than the number of capacitors used to generate the different output levels. Remarkably, the technique does not require precise voltage references to achieve high linearity performance. However, the number of DAC levels produced by the DAC described in the technical paper is five. Extending the technique to include more than five levels would involve a significant increase in hardware and complexity.

FIG. 1A illustrates an exemplary 5-level switched capacitor DAC 100 that includes two capacitors $C_A$ and $C_B$, an integrator implemented with operational transconductance amplifier (OTA) 102 and integration capacitor $C_{int}$, switches 104 and 106 used to couple reference voltages $V_{A1}$ and $V_{A2}$ to the bottom plate of capacitor $C_A$, switches 108 and no used to couple reference voltages $V_{B1}$ and $V_{B2}$ to the bottom plate of capacitor $C_B$, switch 112 used to couple common mode voltage $V_{cm}$ to the top plate of capacitors $C_A$ and $C_B$, and switch 114 used to couple the top plate of capacitors $C_A$ and $C_B$ to the input of the integrator. Input capacitor $C_{in}$ and switches 116, 118, 120 and 122 form an input stage that may be used to effectively sum input voltage $V_{in}$ with the DAC output voltage. In sigma-delta modulator implementations, DAC 100 may form the DAC and input stage of the modulator.

In DAC 100, capacitors $C_A$ and $C_B$ have the same nominal capacitance value and are respectively charged to voltages $V_{A1}$ and $V_{B1}$ via switches 104 and 108 during a precharge phase $\varphi_1$, and later charged to voltages $V_{A1}$ and $V_{B1}$ via switches 106 and no during an integration phase $\varphi_2$. Clock phases $\varphi_1$ and $\varphi_2$ are typically non-overlapping.

For a typical thermometric DAC, the code dependent voltages applied to DAC 100 are shown in the table of FIG. 1B for a five level DAC having input codes+2, +1, 0, −1 and −2. FIG. 1C visually illustrates the same information shown in FIG. 1B. Each arrow within each code corresponds to a capacitor; the tail of the arrow lies on the voltage value at which the capacitor is connected during $\varphi_1$, while the head of the arrow indicates the voltage at $\varphi_2$. For example, arrows 134, 138, 142, 146 and 150 correspond to capacitor $C_A$, while arrows 132, 136, 140, 144 and 148 correspond to capacitor $C_B$. When only the head of the arrow is shown, such as with arrows 136, 140, 142 and 144, it means that the voltages used in the two phases are the same, and effectively the capacitor is not injecting any charge into $C_{int}$. In this thermometric DAC it is clear that a mismatch between $C_A$ and $C_B$ will cause the 5-point characteristic of the DAC to be non-linear. To address this problem, an additional reference voltage $V_{cm}=(V_{DD}+V_{SS})/2$ can be used for codes+1 and −1 such that each capacitor injects a same reduced amount of charge instead of a single capacitor being responsible for injecting the full amount of charge.

FIG. 1D illustrates a table showing the value of the voltages applied to nodes $V_{A1}$, $V_{A2}$, $V_{B1}$ and $V_{B2}$ with respect to each of the five input codes+2, +1, 0, −1 and −2 according to this modified reference voltage switching scheme, and FIG. 1E illustrates a corresponding arrow diagram.

To provide an example of how the switching scheme improves the linearity of the DAC, consider the case of a 20% mismatch on $C_A$ (represented by a larger arrow) while keeping $C_B$ and the voltage $V_{cm}$ ideal, represented in the arrow diagram in FIG. 1F. For the code+2, the DAC injects a charge that is 10% higher than the ideal case (($V_{DD}-V_{SS}$) (2C+0.2C) instead of ($V_{DD}-V_{SS}$)·(2C)). Since for the code+1 $C_A$ is still used but precharged/discharged to a voltage that is nominally half of the previous, the difference from the ideal charge value in this case is 5%, exactly half than before. Applying the same reasoning for the negative codes, and noticing that in this scenario the 0 value is not dependent on the capacitor values, it can be seen that all the points in the DAC characteristic describe a straight line. The capacitor mismatch translates only to a gain error that does not affect the linearity of the DAC.

Next, consider the case where capacitors $C_A$ and $C_B$ are matched, but there is an error $\Delta V$ on the reference voltage $V_{cm}$, which is represented by the arrow diagram of FIG. 1G. Here, it can be seen that mismatch $\Delta V$ does not affect codes+2, 0 and −2 because $V_{cm}$ is not applied to capacitors $C_A$ and $C_B$ for these codes. For codes+1 and −1, even though the voltage $V_{cm}$ is not perfectly centred in the range ($V_{DD}-V_{SS}$), a variation $\Delta VC$ in the charge of $C_A$ is compensated by a variation $-\Delta VC$ in the charge of $C_B$. Graphically this corresponds to the fact that the first arrow reduces in length by exactly the amount that the second arrow increases. In the case where both capacitor mismatch and the voltage error are simultaneously present, the effect on the linearity of the DAC is proportional to $\Delta C\Delta V$, which is typically orders of magnitudes less than the non-linearity of a conventional thermometric DAC, in which the effect of capacitor mismatch on the DAC's linearity is proportional to $\Delta C(V_{DD}-V_{SS})$.

The improved switching scheme represented by the tables and diagrams of FIGS. 1D to 1G can be implemented when (1) all capacitors are used for each code; (2) all capacitors provide the same nominal charge within each respective code; and (3) a same number of capacitors are coupled to a particular intermediate voltage during the first switching phase $\varphi_1$ and the second switching phase $\varphi_2$. These conditions can be visually represented in arrow diagrams in which (1) all arrows are used for each code; (2) all arrows have the same length in each code; and (3) for every intermediate voltage, the number of arrow heads arriving at a particular point are equal to a number of arrows leaving the point.

The improved switching scheme described above can be extended to DACs having more than five output levels by employing more capacitors and more reference voltage levels. For example, extending the five level DAC to a seven level DAC can be achieved by configuring the DAC to generate output levels in response to codes+3 and −3. It can be shown that in order to extend the switching scheme to add additional uniformly distributed DAC codes, the number of capacitors $N_C$ used in the DAC is the least common multiple (LCM) of the number of levels $N_L$ provided by the DAC:

$$N_C = LCM\left(1, 2, 3, \ldots, \frac{N_L-1}{2}\right).$$

The number of intermediate reference voltages $N_V$ between $V_{DD}$ and $V_{SS}$ provided to the bottom plates of the DAC capacitors is:

$$N_V = N_C - 1.$$

FIG. 1H illustrates an arrow diagram associated with a seven level DAC in which the number of capacitors $N_C$ is six and the number of intermediate voltage levels $N_L$ is five. FIG. 1I illustrates a table showing the number of DAC capacitors $N_C$ needed for a corresponding number of DAC levels $N_L$ for $N_L$=5, 7, 9, 11, 13 and 15. It can be seen that the number of DAC capacitors $N_C$ rapidly increases with increasing number of DAC levels. For example, 60 capacitors are used for 13 DAC levels, and 420 capacitors are used for 15 DAC levels.

In embodiments of the present invention, the number of DAC levels is increased without significantly increasing the number of DAC capacitors $N_C$ or the number of intermediate reference voltages $N_V$ by using a DAC with a non-uniformly distributed input code and a charge accumulator. Since the number of needed capacitors depends on the LCM of the DAC codes, embodiment DACs may utilize codes that reduce or minimize the increase of the LCM. For example, in an embodiment, the set of DAC input codes is reduced such that the prime number DAC codes ±3 are skipped, such that the DAC codes form a non-uniformly space set of codes that includes 0, ±1, ±2, and ±4. Since the LCM of 1, 2 and 4 is equal to 4, an embodiment highly linear DAC having non-uniformly space input codes can be implemented using four capacitors and three intermediate voltages. An arrow diagram corresponding to such an embodiment is illustrated in FIG. 2A.

The concept of a non-uniformly coded highly linear DACs can be extended by adding other codes that correspond to a power of 2 (e.g. ±8, ±16). In some embodiments, highly linear DACs can be combined with a non-uniform quantizer to implement a sigma-delta analog-to-digital converter. In general, by using a non-uniformly coded highly linear DAC with maximum codes ±M, an ADC, such as a sigma-delta ADC, can be constructed that has a similar dynamic range (DR) as an ADC utilizing a DAC having 2M+1 uniformly distributed levels. However, the SNDR of the converter is reduced at higher input amplitudes due to the coarser DAC steps at higher input code levels.

In various embodiments, a DAC having uniformly distributed output levels can be constructed using an embodiment non-uniformly coded highly linear DAC over a plurality of conversion cycles. For example, the input code of the DAC can be divided in groups and converted at different times during a conversion period such that the same capacitors are charged and discharged multiple times within a conversion period. In some embodiments, a faster clock is used to achieve these multiple conversion cycles within the conversion period. In this manner, the accumulated charge provided by the capacitors over the multiple conversion cycles is proportional to a value of the uniformly distributed input code.

For example, an embodiment 13-level uniformly coded highly linear DAC can be implemented using the embodiment 7-level non-uniformly coded highly linear DAC corresponding to the arrow diagram of FIG. 2A. In order to expand the number of DAC levels from 7 to 13, a 13-level uniform input code is split into two non-uniformly coded DAC input words having a sum that is equal to the 13-level uniformly coded input word. In one embodiment, the uniform input code is split into a most significant code (MSC) with a code space having code values of −4, 0 and +4, and a least significant code (LSC) with a code space having code values of −2, −1, 0, +1 and +2. The DAC converts and accumulates the MSC and the LSC in successive cycles such that the final DAC output is the sum of the converter MSC and LSC. In various embodiments the DAC outputs for the MSC and LSC are summed using a charge accumulator such as an integrator.

FIG. 2B illustrates a table that shows how DAC input codes can be mapped to MSCs and LSCs for input codes from −6 to +6. For example, the input code+3 is mapped to an MSC of +4 and an LSC of −1 such that the sum of +4 and −1 form+3. It should be understood that the mapping of the uniformly distributed input code to the MSC and LSC shown in FIG. 2B is just one example of a code mapping that represents coverts a 13-level uniformly distributed code to a 7-level non-uniformly distributed code. In alternative embodiments, different values could be used for the MSC and LSC in order to represent the same uniform input code. For example, an input code of +2 could be formed by an MSC of 0 and an LSC of +2 as shown in the diagram of FIG. 2B, or the input code of +2 could be alternatively mapped using an MSC of +4 and an LSC of −2. In other words, in alternative embodiments, any particular uniformly distributed input code value could be mapped to any combination of MSC and LSC values whose sum forms the uniform input code.

Figure 3A:
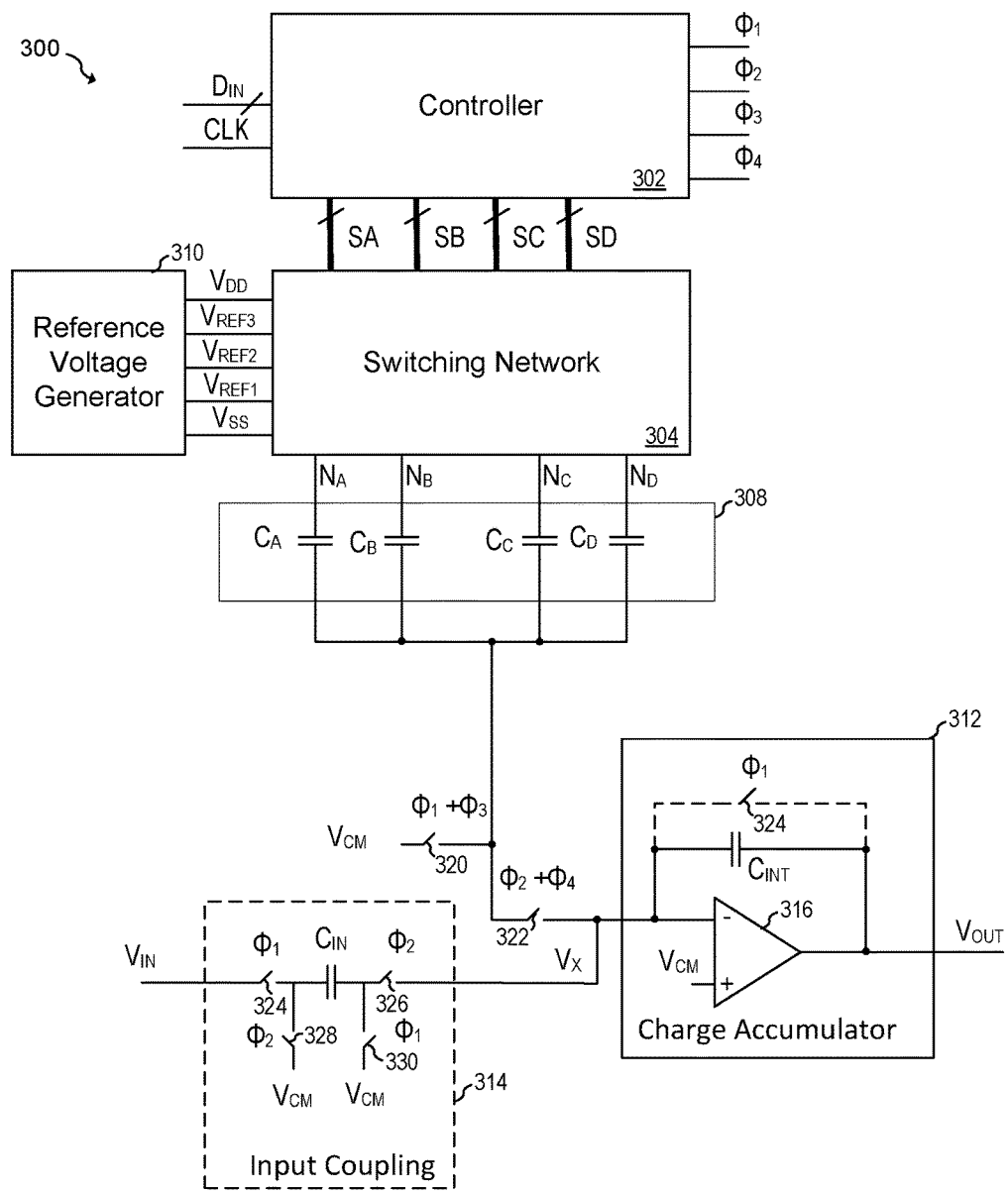
FIG. 3A illustrates a DAC according to an embodiment of the present invention.

FIG. 3A illustrates a schematic of an embodiment DAC circuit 300 that may be used to implement the switching scheme and code mapping technique illustrated in FIGS. 2A and 2B described above. DAC circuit 300 includes a controller 302, a switching network 304, a reference voltage generator 310, a capacitor array 308, a charge accumulator 312 and an input coupling network 314.

During operation, controller 302 receives uniformly coded digital input data via data input $D_{IN}$ and converts the uniformly coded digital input to a non-uniformly coded MSC and LSC. In the embodiment of FIG. 3A, the DAC input is a 13-level code that is mapped to an MSC and an LSC, for example, according to the table of FIG. 2B described above. Based on the 13-level input code and an input clock CLK, controller 302 generates a non-overlapping four phase clock $\varphi_1$, $\varphi_2$, $\varphi_3$ and $\varphi_4$, and switching signals SA, SB, SC and SD used to select reference voltages $V_{SS}$, $V_{REF1}$, $V_{REF2}$, $V_{REF3}$ and $V_{DD}$ that are applied to the terminals of capacitors $C_A$, $C_B$, $C_C$ and $C_D$ during non-overlapping clock phases $\varphi_1$, $\varphi_2$, $\varphi_3$ and $\varphi_4$. In various embodiments, reference voltages $V_{SS}$, $V_{REF1}$, $V_{REF2}$, $V_{REF3}$ and $V_{DD}$ are applied to the bottom plates of capacitors $C_A$, $C_B$, $C_C$ and $C_D$ in accordance with the arrow diagram of FIG. 2A. The resulting charge provided by capacitors $C_A$, $C_B$, $C_C$ and $C_D$ is accumulated by charge accumulator 312 using switched capacitor techniques known in the art.

Figure 3B:
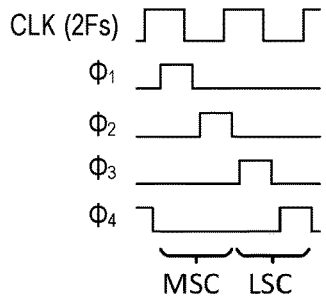
FIG. 3B illustrates an embodiment timing diagram.

In various embodiments, the MSC and the LSC are converted over successive conversion cycles. For example, the MSC could be converted in a first conversion cycle followed by the LSC in a second conversion cycle. In such a system, input clock CLK provided to controller 302 is twice the sampling rate Fs of the input data provided at input $D_{IN}$. FIG. 3B illustrates a timing diagram showing the relationship between clock CLK operating at 2Fs, non-overlapping clock phases $\varphi_1$, $\varphi_2$, $\varphi_3$ and $\varphi_4$, and the conversion periods for the MSC and the LSC. As shown, the MSC is converted during clock phases $\varphi_1$ and $\varphi_2$, and the LSC is converted during non-overlapping clock phases $\varphi_3$ and $\varphi_4$. The charge transferred during clock phases $\varphi_1$ and $\varphi_2$ may be referred to as a "first charge," and the charge transferred during clock phases $\varphi_3$ and $\varphi_4$ may be referred to as a second charge. It should be understood that the conversion schedule shown in the timing diagram of FIG. 3B is just one of a number of possible conversion schedules. For example, in an alternative embodiment, the LSC or "second charge" could be converted first during phases $\varphi_1$ and $\varphi_2$ followed by the MSC or "first charge" in phases $\varphi_3$ and $\varphi_4$. In yet other embodiments, portions of the MSC and LSC could be converted over three or more conversion periods.

Turning back to FIG. 3A, the operation of DAC 300 is now described. During non-overlapping clock phase $\varphi_1$, switching network 304 causes a first set of voltages to be applied to the bottom plates of capacitors $C_A$, $C_B$, $C_C$ and $C_D$, while the top plates of capacitors $C_A$, $C_B$, $C_C$ and $C_D$ are charged to reference voltage $V_{CM}$ via switch 32o. Switch 322 that couples the input of charge accumulator 312 to the top plates of capacitors $C_A$, $C_B$, $C_C$ and $C_D$ is opened. During non-overlapping clock phase $\varphi_2$, switching network 304 causes a second set of voltages to be applied to the bottom plates of capacitors $C_A$, $C_B$, $C_C$ and $C_D$, while the top plates of capacitors $C_A$, $C_B$, $C_C$ and $C_D$ are coupled to the input of charge accumulator 312 via switch 322. Accordingly, during phases $\varphi_1$ and $\varphi_2$, a charge is transferred to charge accumulator 312 based on the product of the respective capacitances of capacitors $C_A$, $C_B$, $C_C$ and $C_D$ and the difference between the respective voltages of the first and second set of voltages. These charges, for example, may represent the MSC of the DAC code.

Next, during non-overlapping clock phase $\varphi_3$, switching network 304 causes a third set of voltages to be applied to the bottom plates of capacitors $C_A$, $C_B$, $C_C$ and $C_D$, while the top plates of capacitors $C_A$, $C_B$, $C_C$ and $C_D$ are charged to reference voltage $V_{CM}$ via switch 320. Switch 322 that couples the input of charge accumulator 312 to the top plates of capacitors $C_A$, $C_B$, $C_C$ and $C_D$ is opened. During non-overlapping clock phase $\varphi_4$, switching network 304 causes a fourth set of voltages to be applied to the bottom plates of capacitors $C_A$, $C_B$, $C_C$ and $C_D$, while the top plates of capacitors $C_A$, $C_B$, $C_C$ and $C_D$ are coupled to the input of charge accumulator 312 via switch 322. Accordingly, during phases $\varphi_3$ and $\varphi_4$, a charge is transferred to charge accumulator 312 based on the product of the respective capacitances of capacitors $C_A$, $C_B$, $C_C$ and $C_D$ and the difference between the respective voltages of the first and second set voltages. These charges, for example, may represent the LSC of the DAC code.

In an embodiment, charge accumulator 312 includes an integrator that includes amplifier 316 and integration capacitor $C_{INT}$. Amplifier 316 may be implemented, for example, using an operational transconductance amplifier (OTA). In some embodiments, switch 324 coupled between the output of amplifier 316 and negative input of amplifier 316 is opened during phase $\varphi_1$ in order to reset the charge accumulator such that output voltage $V_{OUT}$ represents the DAC output at the end of phase $\varphi_4$. The connection to switch 324 is shown in dashed lines to indicate that this feature is optional. For example, in embodiments in which charge accumulator 312 functions as an integrator used in a sigma-delta converter, charge accumulator may not need to be reset.

In some embodiments, such as DACs used for sigma-delta converters, an input coupling network 314 is coupled to amplifier 316 in order to sum voltage $V_{IN}$ with the converted DAC output. As shown, input coupling network 314 is implemented as a switched-capacitor network that includes capacitor $C_{IN}$, switches 324, 326, 328 and 330. Switches 324 and 330 are closed during $\varphi_1$, and switches 326 and 328 are closed during $\varphi_2$. In some embodiments, switches 324 and 330 are also closed during $\varphi_3$, and switches 326 and 328 are also closed during $\varphi_4$, in which case, the size of capacitor $C_{IN}$ may be advantageously reduced in half. The switched-capacitor input coupling network 314 shown may be used in discrete-time sigma-delta converters. It should be understood that input coupling network is just one of a number of different input coupling circuits that could be used with DAC 300. In alternative embodiments, other circuits could be used. These alternative circuits could include known discrete-time circuits, such as other switch capacitor circuits and/or continuous time circuits.

FIG. 3C illustrates a table 370 that shows which reference voltages are coupled to the bottom plates of capacitors $C_A$, $C_B$, $C_C$ and $C_D$ during non-overlapping clock phases $\varphi_1$, $\varphi_2$, $\varphi_3$ and $\varphi_4$ for each of the seven non-uniformly spaced input levels in accordance with an embodiment. The left-hand column of table 370 lists the non-uniformly distributed input code, and succeeding columns denote which voltages are applied to each capacitor $C_A$, $C_B$, $C_C$ and $C_D$ during phases $\varphi_1$ and $\varphi_3$ and during phases $\varphi_2$ and $\varphi_4$. Table 370 corresponds to the arrow diagram of FIG. 2A. It should be understood that the entries of table 370 is just one example of how reference voltages can be coupled to the bottom plates of $C_A$, $C_B$, $C_C$ and $C_D$.

In various embodiments, for a non-zero LSC, such as −2, −1, 1 and 2, the controller 302 is configured to apply a first voltage difference formed by a first pair of outputs of the reference voltage generator to a first subset of the plurality of capacitors, and to apply a second voltage difference formed by a second pair of outputs of the reference voltage generator 310 to a second subset of the plurality of capacitors different from the first subset, such that the first pair of outputs are different from and share a common output with the second pair of outputs. For example, for a non-zero LSC input code of 2, capacitors $C_A$, $C_B$, $C_C$ and $C_D$ are divided into a first subset that includes capacitors $C_A$ and $C_B$, and a second subset that includes capacitors $C_C$ and $C_D$. A first voltage difference formed by reference voltages $V_{SS}$ and $V_{REF2}$ is applied to capacitors $C_A$ and $C_B$ of the first subset, and a second voltage difference formed by reference voltage $V_{DD}$ and $V_{REF2}$ is applied to capacitors $C_C$ and $C_D$ of the second subset. Here, the common reference voltage output is $V_{REF2}$. This sharing of a common reference voltage output between two subsets of reference voltage outputs is represented, for example, in the arrow diagram of FIG. 2A with respect to the head of one arrow sharing a same reference voltage with a tail of another arrow.

In alternative embodiments, other equivalent combinations of voltages could be used. For example, for input code 1, the various voltage combinations could be swapped between capacitors over the various columns. Also, for input code zero, other voltages beside $V_{REF2}$ could be coupled to the bottom plates of $C_A$, $C_B$, $C_C$ and $C_D$ during phases $\varphi_1$, $\varphi_2$, $\varphi_3$ and $\varphi_4$.

It should be appreciated that the embodiment of FIG. 3A is just one example of many possible circuit implementations of an embodiment DAC. In alternative embodiments of the present invention, DAC 300 could be implemented differentially using differential circuit design techniques known in the art. For example, an embodiment differential DAC could be implemented using two capacitor arrays 308 and by using a differential structure for charge accumulator 312 (e.g., using a fully differential amplifier for amplifier 316 and two integration capacitors $C_{INT}$). In further alternative embodiments, reference voltage $V_{REF2}$ could be used in place of voltage $V_{CM}$ and/or switching network 304 could be coupled to the top plates of capacitors $C_A$, $C_B$, $C_C$ and $C_D$ instead of the bottom plates.

In some embodiments, an additional DAC may be added to address linearity issues stemming from finite gain of amplifier 316 in charge accumulator 312. Anything that changes the DAC gain in the first half of the period compared to the second half, effectively changes the gain of the MSC with respect to the LSC, which translates into a non-linearity since the MSC and the LSC are converted using slightly different gains.

The transfer function of charge accumulator 312 can be represented in the z-domain as follows:

$$\frac{V_o(z)}{V_i(z)} = \frac{C_{in}/C_{INT}}{\left(1 + \frac{1}{A_0}\right)(1+\epsilon)} \frac{1}{\left(z - \frac{1}{1+\epsilon}\right)},$$

where $A_0$ is the gain of amplifier 316, $C_{in}$ is the combined capacitance of capacitor array 308, $C_{INT}$ is the capacitance of integration capacitor $C_{INT}$, and $$\epsilon = \frac{C_{in}}{C_{int}(A_0 + 1)}.$$

The term $$\left(1 + \frac{1}{A_0}\right)(1+\epsilon)$$

slightly changes the gain of the transfer function. The shift in the pole position from 1 to $$\frac{1}{1+\epsilon}$$

is caused by charge leakage from one conversion to the next. In systems where the integrator is engaged only once per period, these effects do not degrade the linearity of the integrator. However, in embodiments, the effect of the leaky integrator is that the MSC and LSC are prone to have different gains. This occurs because some of the charge that is transferred to charge accumulator 312 during phase $\varphi_2$ at the first conversion phase is discharged prior to the end of phase $\varphi_4$ of the second conversion phase.

The effect of the leaky integrator can be modeled by attributing a different gain to the MSC and the LSC as follows:

$$Q_{DAC} = (1-\kappa)Q_{MSC} + Q_{LSC},$$

where $\kappa$ is the gain error, $Q_{MSC}$ is the remaining transferred charge corresponding to the MSC converted during the first cycle, $Q_{LSC}$ is the transferred charge corresponding to the LSC converted during the second cycle, and $Q_{DAC}$ is the total charge remaining at the end of the second cycle.

Figure 4A:
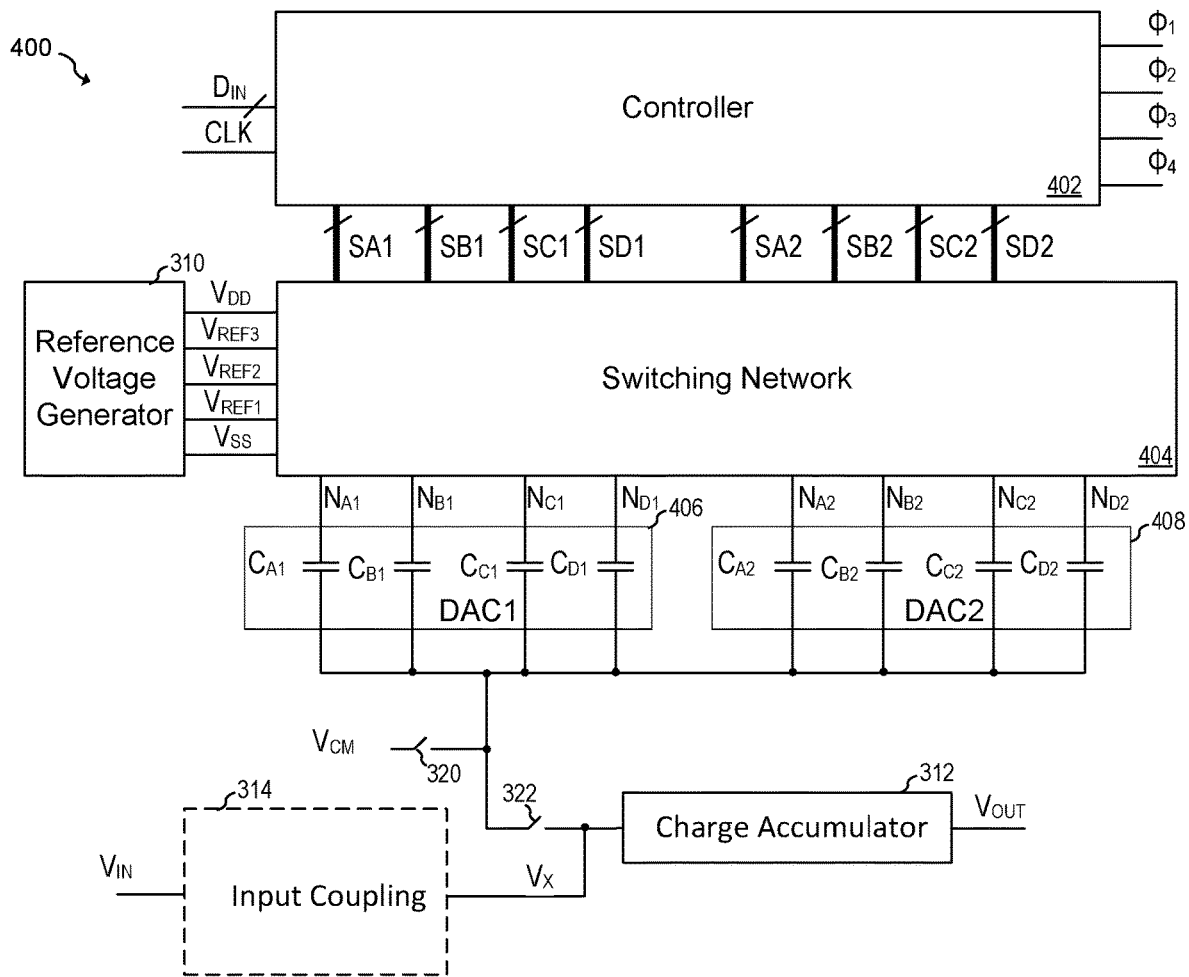
FIG. 4A illustrates a DAC according to an alternative embodiment.

In an embodiment, the effect of finite amplifier gain on the gain of the MSC and LSC is compensated by converting portions of the MSC and the LSC during both the first and second conversion cycles. This can be achieved by using two switched capacitor DAC arrays 406 and 408 as shown in FIG. 4A, which illustrates a DAC 400 according to a further embodiment. DAC 400 is similar in structure to DAC 300 shown in FIG. 3A, with the exception that two switched capacitor DAC arrays 406 and 408 are used instead of a single capacitor array 308. In various embodiments, each switched capacitor DAC array 406 and 408 has the same number of capacitors as the single capacitor array 308. However, in some embodiments, the capacitance values for each capacitor $C_{A1}$, $C_{B1}$, $C_{C1}$ and $C_{D1}$ in switched capacitor array 406 and each capacitor $C_{A2}$, $C_{B2}$, $C_{C2}$ and $C_{D2}$ in switched capacitor array 408 may be one-half the capacitance of each capacitor $C_A$, $C_B$, $C_C$ and $C_D$ in capacitor array 308 shown in FIG. 3A. Controller 402 and switching network 404 is adapted to independently route the output of reference voltage generator 310 to the bottom plates of capacitors $C_{A1}$, $C_{B1}$, $C_{C1}$, Cm, $C_{A2}$, $C_{B2}$, $C_{C2}$ and $C_{D2}$ via switching signals $S_{A1}$, $S_{B1}$, $S_{C1}$, $S_{D1}$, $S_{A1}$, $S_{B2}$, $S_{C2}$ and $S_{D2}$.

Figure 4B:
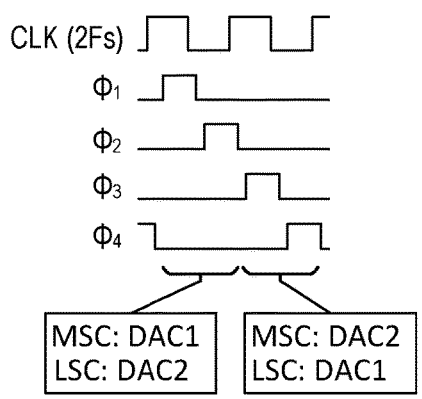
FIG. 4B illustrates a timing diagram associated with the DAC embodiment of FIG. 4A.

In an embodiment, the capacitors of switched capacitor DAC array 406 (also referred to as "DAC1") converts the MSC or "first charge", and the capacitors of switched capacitor DAC array 406 (also referred to as "DAC2") converts the LSC (also referred to as a "further second charge") during phases $\varphi_1$ and $\varphi_2$. Next, the capacitors of switched capacitor DAC array 406 (DAC1) converts the LSC or "second charge", and the capacitors of switched capacitor DAC array 406 (DAC2) converts the MSC (also referred to as a "further first charge") during phases $\varphi_3$ and $\varphi_4$ as shown in the timing diagram of FIG. 4B. The resulting DAC charge $Q_{DAC_{dual}}$ after phase $\varphi_4$ can be represented as:

$$Q_{DAC_{dual}} = (1-\kappa)\frac{Q_{MSC}}{2} + \frac{Q_{LSC}}{2} + (1-\kappa)\frac{Q_{LSC}}{2} + \frac{Q_{MSC}}{2};$$

Reordering the terms, the following expression is obtained:

$$Q_{DAC_{dual}} = \left(1 - \frac{\kappa}{2}\right)(Q_{MSC} + Q_{LSC}).$$

It can be seen by the above expression for $Q_{DAC_{dual}}$ that the same gain $$\left(1 - \frac{\kappa}{2}\right)$$

is applied to both the MSC and the LSC, thereby improving the linearity of the embodiment DAC.

Figure 5A:
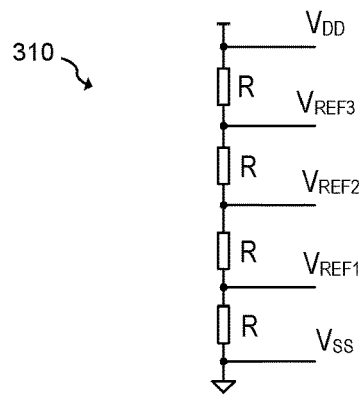
FIG. 5A illustrates an embodiment reference voltage generator.

FIGS. 5A-5D illustrate schematics of possible implementations of some of the blocks of DAC 300 shown in FIG. 3A. FIG. 5A illustrates a possible implementation of reference voltage generator 310 shown in FIG. 3A that is configured to provide divided reference voltages. In some embodiments, these divided reference voltages may be evenly spaced in terms of voltage. Embodiment reference voltage generator 310 is shown implemented as a resistive voltage divider that includes series resistors with value R coupled between power supply node $V_{DD}$ that provides an upper or maximum reference voltage and power supply node $V_{SS}$ that provides a minimum or lower reference voltage. Accordingly, intermediate voltages $V_{REF1}$, $V_{REF2}$ and $V_{REF3}$ are evenly divided between $V_{DD}$ and $V_{SS}$. In various embodiments, voltage $V_{REF2}$ represents an average voltage of $V_{DD}$ and $V_{SS}$, voltage $V_{REF3}$ represents an average voltage of $V_{DD}$ and $V_{REF2}$, and voltage $V_{REF1}$ represents an average voltage of $V_{REF2}$ and $V_{SS}$. In some embodiments, power supply node $V_{DD}$ may be a positive voltage and power supply node $V_{SS}$ may be a ground node. Alternatively, other power supply nodes or reference nodes could be used.

Figure 5B:
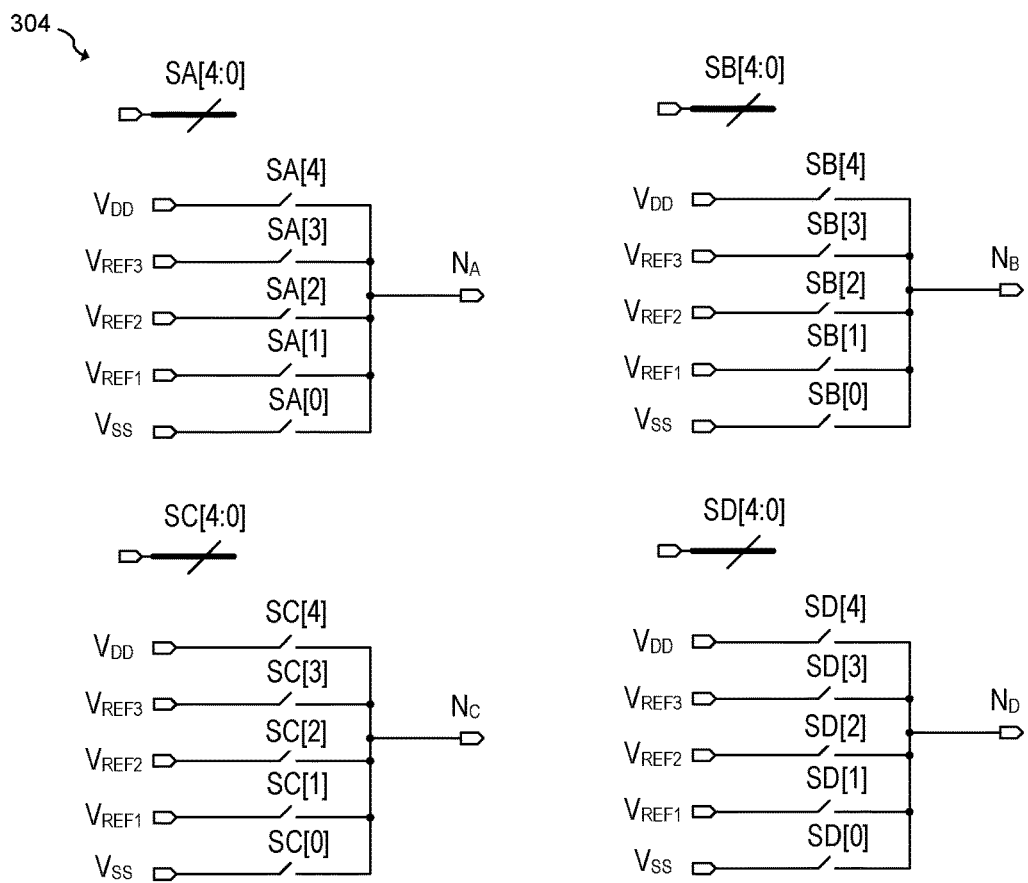
FIG. 5B illustrates an embodiment switching network.

FIG. 5B illustrates a schematic of a possible implementation of switching network 304 shown in FIG. 3A. As shown, switching network 304 includes four sets of switches that are coupled between each reference voltage $V_{SS}$, $V_{REF1}$, $V_{REF2}$, $V_{REF3}$ and $V_{DD}$ and a respective node NA, NB, $N_C$ and ND that are respectively coupled to the bottom plates of capacitors $C_A$, $C_B$, $C_C$ and $C_D$. During operation, controller 302 activates a single signal in each of the control buses SA[4:0], SB[4:0], SC[4:0] and SD[4:0] in order to route one of reference voltage $V_{SS}$, $V_{REF1}$, $V_{REF2}$, $V_{REF3}$ and $V_{DD}$ to a bottom plate of a corresponding capacitor during each one of non-overlapping clock phases $\varphi_1$, $\varphi_2$, $\varphi_3$ and $\varphi_4$. For example, during each non-overlapping clock phase, one of signals SA[4], SA[3], SA[2], SA[1] or SA[0] is asserted in order to activate the respective switch coupled to $V_{SS}$, $V_{REF1}$, $V_{REF2}$, $V_{REF3}$ or $V_{DD}$. Each switch may be implemented using a switching transistor or CMOS transmission gate known in the art. It should be understood that in alternative embodiments, other functionally equivalent switching networks could be used to implement switching network 304.

Figure 5C:
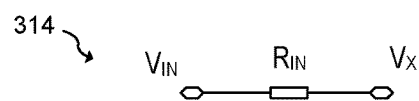
FIG. 5C illustrates an embodiment input coupling network.

FIG. 5C illustrates an alternative embodiment implementation of input coupling network 314 shown in FIG. 3A. As shown, alternative input network 314 includes a resistor $R_{IN}$ coupled between input node $V_{IN}$ and node $V_X$ coupled to the input of charge accumulator 312. Input coupling network 314 shown in FIG. 5C may be used, for example, as an input network in continuous time sigma-delta modulators.

Figure 5D:
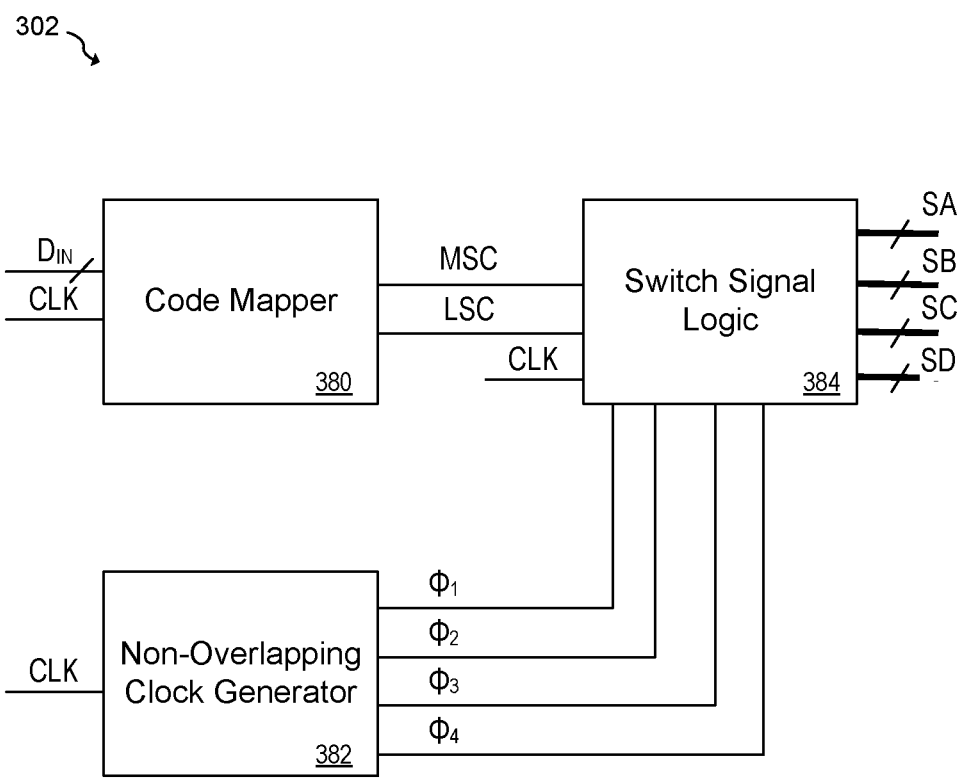
FIG. 5D illustrates an embodiment controller.

FIG. 5D illustrates a block diagram of a controller 302 that could be used to implement controller 302 shown in FIG. 3A. As shown, controller 302 includes a code mapper 380, a non-overlapping clock generator 382, and switch signal logic 384. Code mapper is configured to convert a uniform DAC code provided at input $D_{IN}$ to an MSC and an LSC of a non-uniformly distributed DAC code according to embodiments of the present invention described herein. For example, code mapper 38o may be configured to implement the code mapping table of FIG. 2B. Code mapper 38o may be implemented using digital logic circuits known in the art such as custom combinatorial logic, programmable logic, a lookup table or other known logic circuitry.

Non-overlapping clock generator 382 is configured to generate non-overlapping clock phases $\varphi_1$, $\varphi_2$, $\varphi_3$ and $\varphi_4$ from clock signal CLK, and may be implemented using non-overlapping clock generation circuits known in the art.

Switch signal logic 384 is configured to provide switch control signals SA, SB, SC and SD based on signals MSC, LSC, CLK and the four non-overlapping clock phases $\varphi_1$, $\varphi_2$, $\varphi_3$ and $\varphi_4$. In one embodiment, switch signal logic 384 is configured to provide control signals that implement the reference voltage to capacitor routing shown in the table of FIG. 3C. Control signals SA, SB, SC and SD may also be gated by non-overlapping clock phases $\varphi_1$, $\varphi_2$, $\varphi_3$ and $\varphi_4$. Switch signal logic 384 may be implemented using digital logic known in the art, such as a state machine, a processor or other logic type. In some embodiments, the logic used to implement controller 302 may be synthesized from a logic description written in a hardware description language (HDL) such as VHDL.

It should be understood that the schematics shown in FIGS. 5A-5D are just specific examples of embodiment implementations. In alternative embodiments, other functionally similar circuits known in the art could be used to implement embodiment circuits.

The DAC circuits described herein may be implemented, for example, using a complementary metal oxide semiconductor (CMOS) process, such as a bulk digital CMOS process. Alternatively, other process technologies could be used. In some embodiments, the DAC circuit described herein may be implemented monolithically on a single semiconductor substrate, such as a silicon substrate. In alternative embodiments, the circuits described herein may be partitioned on a plurality of circuit components, such as a plurality of integrated circuits and/or one or more integrated circuits coupled to external components such as passive components.

Figure 6A:
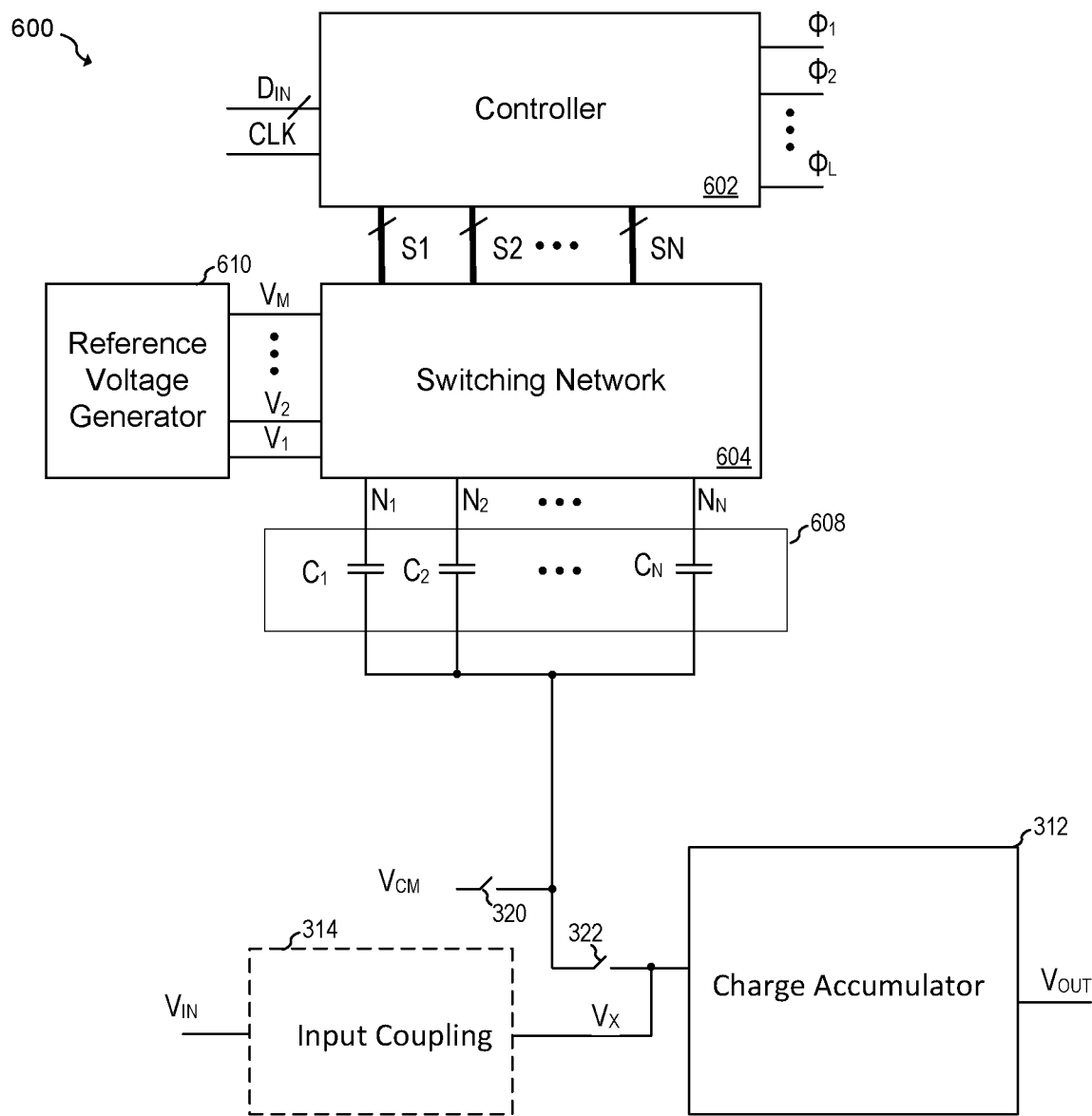
FIG. 6A illustrates a DAC according to a further embodiment.

It should be understood that embodiment highly linear DACs are not limited to the 13-level DAC described with respect to the embodiments of FIGS. 2A, 2B, 3A-3C, 4 and 5A-5D. DACs having other numbers of levels may also be implemented as shown in FIG. 6A, which illustrates a DAC 600 according to an alternative embodiment of the present invention. DAC 600 has a similar structure as DAC 300 shown in FIG. 3A with the exception that the DAC is configured to use N capacitors $C_1$ to $C_N$ in capacitor array 608 to achieve a number of DAC levels greater than 13. Controller 602 is configured to provide N sets of control signals Si to SN to switching network 604 and L clock phases $\varphi_1$ to $\varphi_L$. Reference voltage generator 610 is configured to provide M reference voltages to switching network 604 that is adapted to route reference voltages $V_1$ to $V_M$ to the bottom plates of capacitors $C_1$ to $C_N$. Reference voltage generator 610, switching network 604 and controller 602 may be implemented in a similar manner as described above with respect to FIGS. 5A, 5B and 5D with suitable modifications for additional signals.

In embodiments of the present invention, the number of DAC levels may be increased by increasing the number of capacitors by factors of two and increasing the number of conversion cycles. For example, a 29 level DAC could be constructed using 8 capacitors, 7 intermediate voltage levels and three conversion cycles, and a 61 level DAC could be constructed using 16 capacitors, 15 intermediate voltage levels and four conversion cycles.

Figure 6B:
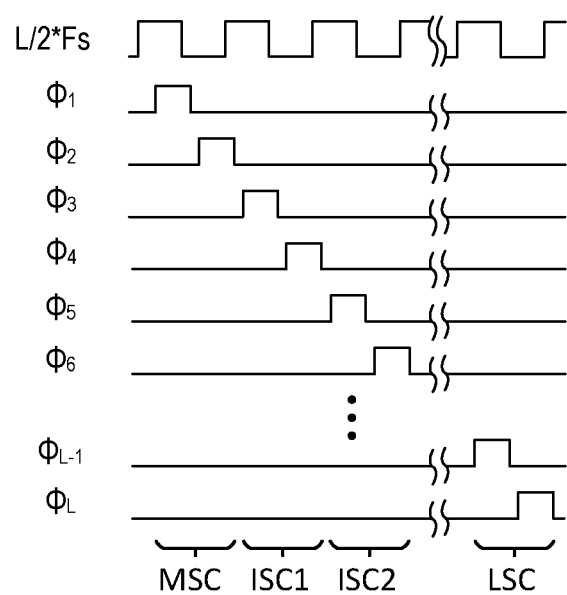
FIG. 6B illustrates a timing diagram associated with the embodiment DAC of FIG. 6A.

FIG. 6B illustrates a timing diagram showing the relationship between clock CLK operating at a frequency of L/2*Fs, non-overlapping clock phases $\varphi_1$ to $\varphi_L$, and various conversion periods for DAC 600 shown in FIG. 6A. As shown, the MSC is converted during phases $\varphi_1$ and $\varphi_2$, intermediate significant codes (ISC) ISC1 and ISC2 are converted over various pairs of clock phases, and the LSC is converted during non-overlapping clock phases $\varphi_{L-1}$ and $\varphi_L$. The number of clock phases and the number of conversion cycles depend on the number of DAC levels for the particular implementation.

It should be understood that the conversion schedule shown in the timing diagram of FIG. 6B is just one of a number of possible conversion schedules. For example, in an alternative embodiment, the LSC could be converted first during phases $\varphi_1$ and $\varphi_2$ followed by the MSC or any one of the ISCs in phases $\varphi_3$ and $\varphi_4$ or any succeeding pair of phases.

Figure 7A:
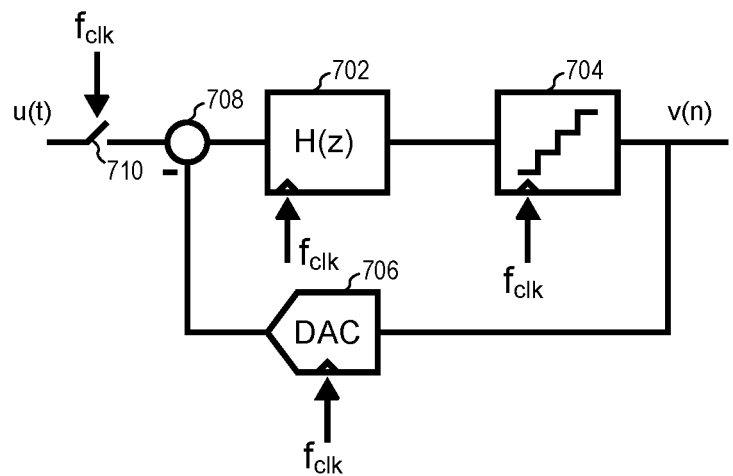
FIGS. 7A, 7B, 7C and 7D illustrate analog-to-digital converters according to embodiments of the present invention.

FIGS. 7A-7D illustrate schematics of analog-to-digital converter circuits that may be implemented using embodiment DACs described herein. FIG. 7A illustrates a discrete-time sigma-delta modulator 700 that includes a sampling circuit 710, a discrete-time filter 702, a multi-bit quantizer 704, and an embodiment DAC. In various embodiments, discrete-time filter 702 implements a discrete-time transfer function H(z) and is typically constructed using one or more switched-capacitor integrator circuits. During operation, sampling circuit 710 samples analog input signal u(t), subtractor circuit 708 subtracts the output of DAC 706 from the sampled analog input signal, discrete-time filter 702 filters the output of subtractor circuit 708, and multi-bit quantizer 704 quantizes the output of discrete-time filter 702 to form a multi-bit quantized digital output v(n). Embodiment DAC converts the quantized digital output of multi-bit quantizer 704 back to the analog domain using systems and methods described herein. In various embodiments, sampling circuit 710, a first integration stage of discrete-time filter 702, subtractor circuit 708 and DAC 706 may be implemented according to the embodiment of FIG. 3A or the embodiment of FIG. 6A.

Figure 7B:
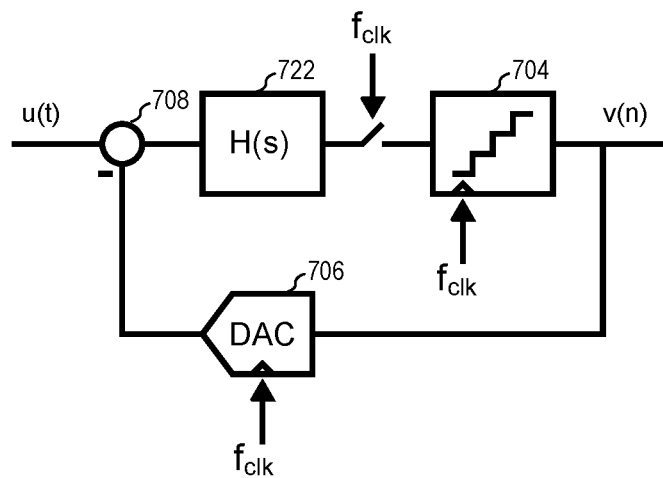

FIG. 7B illustrates a continuous time sigma-delta modulator 720. The structure of continuous time sigma-delta modulator 720 is similar to discrete-time sigma-delta modulator 700 shown in FIG. 7A, with the exception that a continuous time filter 722 is used instead of a discrete time filter, and sampling circuit 710 is omitted. In various embodiments, a first integration stage of continuous time filter 722, subtractor circuit 708 and DAC 706 may be implemented according to the embodiment of FIG. 3A or the embodiment of FIG. 6A using the input stage shown in FIG. 6C.

Figure 7C:
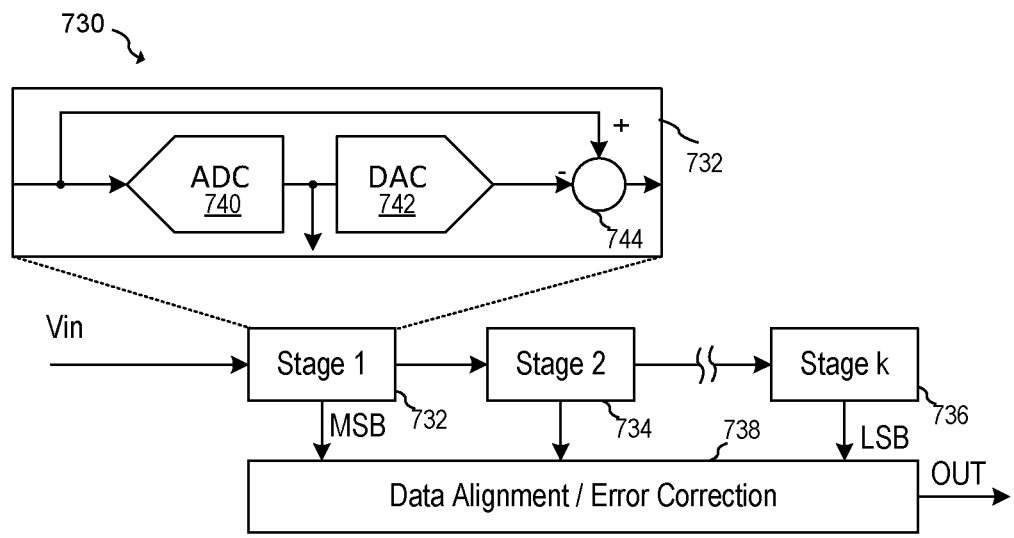

FIG. 7C illustrates a pipelined ADC system 730 that utilizes one or more DACs according to embodiments disclosed herein. Pipelined ADC system 730 includes a total of k pipeline stages 732, 734 and 736. The first pipeline stage includes an ADC 740, a DAC 742 according to embodiments disclosed herein, and a subtractor 744. DAC 742 may be implemented using highly linear switched capacitor DAC implementations described herein.

During operation, first pipeline stage 732 converts input voltage $V_{in}$ to a digital value MSB representing the one or more most significant bits of the conversion. DAC 742 converts the converted value back into the analog domain, and subtractor 744 subtracts the DAC output from the analog input to form a residue signal. This residue signal is passed to the next pipeline stage 734, which amplifies the residue signal and forms a further digital output and a further residue signal in a similar manner as pipeline stage 732. Each respective residue is processed in a similar manner by each of the first k−1 stages to form a plurality of digital outputs and a final residue, which is digitized by the kth stage to yield digital value LSB representing one or more least significant bits of the conversion. In various embodiments, one or more pipelined stages may have a redundant bit range to facilitate pipelined ADC error correction methods known in the art. In the illustrated embodiment, ADC 740 of the first pipeline stage 732 performs a multi-bit conversion.

Data alignment and error correction circuit 738 receives the results of each partial conversion from each pipeline stage 732, 734 and 736 and forms an ADC output code OUT based on these partial conversions. Data alignment and error correction circuit 738 may be implemented using data alignment and error correction methods known in the art. For example, in some embodiments, data alignment and error correction circuit 738 may form a weighted average of each partial conversion to form the final output value.

Figure 7D:
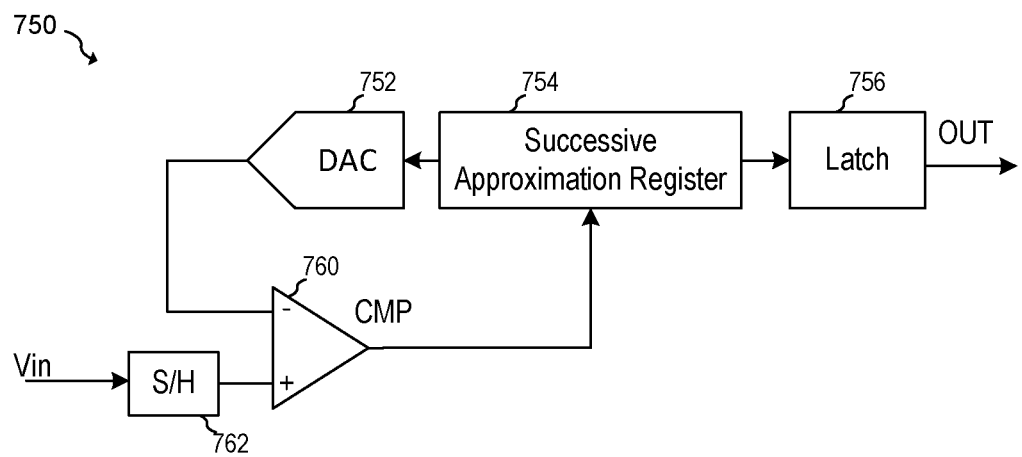

FIG. 7D illustrates a successive approximation register (SAR) ADC system 750 that utilizes an embodiment highly linear DAC described herein. SAR ADC 750 is configured to perform a successive approximation of input voltage $V_{in}$. During operation, input voltage $V_{in}$ is sampled by sample and hold circuit 762. Over a plurality of successive approximation cycles, successive approximation register 754 provides a digital input to DAC 752, and the output of DAC 752 is compared to the sampled input voltage produced by sample and hold circuit 762. At the end of each successive approximation cycle, the content of the successive approximation register 754 is updated based on the output of comparator 760. The output of successive approximation register 754 may be latched by latch 756 at the end of each conversion. DAC 752 may be implemented using a highly linear switched capacitor DAC disclosed in the various embodiments herein. In some embodiments, an embodiment highly linear DAC may be used to convert the most significant bits MSBs, and a more conventional DAC may be used to convert the least significant bits LSBs during operation of SAR ADC system 750.

Figure 8:
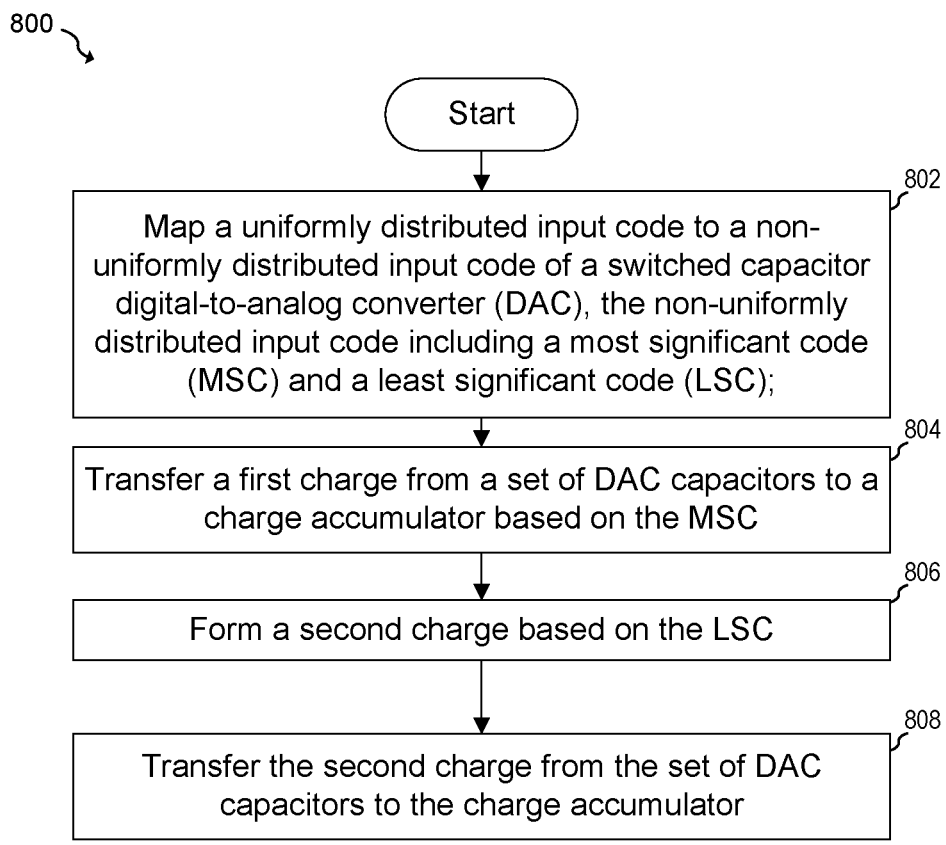
FIG. 8 illustrates a method according to an embodiment of the present invention.

FIG. 8 illustrates a method 800 of performing a digital-to-analog conversion according to an embodiment of the present invention. In step 802, a uniformly distributed input code is mapped to a non-uniformly distributed input code of a switched capacitor digital-to-analog converter (DAC). The non-uniformly distributed input code includes a most significant code (MSC) and a least significant code (LSC). In step 804, a first charge is transferred from a set of DAC capacitors to a charge accumulator based on the MSC, and in step 806 a second charge is formed based on the LSC. In step 808, the second charge is transferred from the set of DAC capacitors to the charge accumulator. In various embodiments, the first charge and the second charge are transferred during different time periods.

In various embodiments, each capacitor of the set of DAC capacitors is used for each value of the non-uniformly distributed input code; and each capacitor of the set of DAC capacitors provides a same corresponding nominal charge within each value of the non-uniformly distributed input code, such that the same nominal charge is proportional to a value of the non-uniformly distributed input code. For a non-zero LSC, the second charge is formed using a plurality of subsets of the set of DAC capacitors and a corresponding plurality of pairs of reference voltages, where each pair of the plurality of pairs of reference voltages share one common reference voltage with an adjacent pair of the plurality of pairs of reference voltages. Each of the plurality of subsets of the DAC capacitors is different from one another, and each of the plurality of pairs of reference voltages is different from one another, and a sum of the first transferred charge and the second transferred charge provides a uniformly distributed output value in accordance with the uniformly distributed input code. Method 800 may be performed, for example, using embodiment DAC circuits described herein.

Embodiments of the present invention are summarized here. Other embodiments can also be understood from the entirety of the specification and the claims filed herein.

Example 1. A method for digital-to-analog conversion, the method including: mapping a uniformly distributed input code to a non-uniformly distributed input code of a switched capacitor digital-to-analog converter (DAC), the non-uniformly distributed input code including a most significant code (MSC) and a least significant code (LSC); transferring a first charge from a set of DAC capacitors to a charge accumulator based on the MSC; forming a second charge based on the LSC; and transferring the second charge from the set of DAC capacitors to the charge accumulator, where each capacitor of the set of DAC capacitors is used for each value of the non-uniformly distributed input code, each capacitor of the set of DAC capacitors provides a same corresponding nominal charge within each value of the non-uniformly distributed input code, where the same nominal charge is proportional to a value of the non-uniformly distributed input code, for a non-zero LSC, the second charge is formed using a plurality of subsets of the set of DAC capacitors and a corresponding plurality of pairs of reference voltages, where each pair of the plurality of pairs of reference voltages share one common reference voltage with an adjacent pair of the plurality of pairs of reference voltages, each of the plurality of subsets of the DAC capacitors is different from one another, and each of the plurality of pairs of reference voltages is different from one another, and a sum of the first transferred charge and the second transferred charge provides a uniformly distributed output value in accordance with the uniformly distributed input code.

Example 2. The method of example 1, where: the non-uniformly distributed input code further includes an intermediate significant code (ISC); and the method includes transferring a third charge from the set of DAC capacitors to the charge accumulator based on the ISC.

Example 3. The method of one of examples 1 or 2, where transferring the first charge is performed during a different time period from transferring the second charge.

Example 4. The method of one of examples 1 to 3, further including: transferring the first charge using the set of DAC capacitors during a first time period; transferring a further second charge using a further set of DAC capacitors during the first time period, where the further set of DAC capacitors has a same number of capacitors as the set of DAC capacitors, and each capacitor of the further set of DAC capacitors has a same capacitance as each capacitor as the set of DAC capacitors; transferring the second charge using the set of capacitors during a second time period; and transferring a further first charge during the second time period using the further set of DAC capacitors.

Example 5. The method of one of examples 1 to 4, where: transferring the first charge from the set of DAC capacitors to the charge accumulator based on the MSC includes, for a non-zero MSC: coupling a first voltage to a first plate of each capacitor of the set of DAC capacitors followed by coupling a second voltage to the first plate of each capacitor of the set of DAC capacitors, where the first and second voltages are provided respectively by a first reference voltage node and a second reference voltage node; and transferring the second charge from the set of DAC capacitors to the charge accumulator based on the LSC includes, for a non-zero LSC: coupling a third voltage to the first plate of a subset of the set of DAC capacitors followed by coupling a fourth voltage to the first plate of the subset of the set of DAC capacitors, where at least one of the third voltage or the fourth voltage is provided by a reference voltage node having a voltage between the first voltage and the second voltage.

Example 6. The method of one of examples 1 to 5, where: the MSC includes code values of +4, 0 and −4; the LSC includes code values of +2, +1, 0, −1, −2; and mapping the uniformly distributed input code to the non-uniformly distributed input code includes: mapping an input code of +6 to an MSC of +4 and an LSC of +2, mapping an input code of +5 to an MSC of +4 and an LSC of +1, mapping an input code of +4 to an MSC of +4 and an LSC of 0, mapping an input code of +3 to an MSC of +4 and an LSC of −1, mapping an input code of +2 to an MSC of +0 and an LSC of +2 or to an MSC of +4 and an LSC of −2, mapping an input code of +1 to an MSC of 0 and an LSC of +1, mapping an input code of 0 to an MSC of 0 and an LSC of 0, mapping an input code of −1 to an MSC of 0 and an LSC of −1, mapping an input code of −2 to an MSC of 0 and an LSC of −2 or to an MSC of −4 and an LSC of +2, mapping an input code of −3 to an MSC of −4 and an LSC of +1, mapping an input code of −4 to an MSC of −4 and an LSC of 0, mapping an input code of −5 to an MSC of −4 and an LSC of −1, and mapping an input code of −6 to an MSC of −4 and an LSC of −2.

Example 7. A digital-to-analog converter (DAC) including: a set of capacitors; a charge accumulator coupled to the set of capacitors; a switching network coupled between the set of capacitors and a plurality of reference voltage nodes; a controller coupled to the switching network, the controller configured to: map a uniformly distributed input code to a non-uniformly distributed input code, the non-uniformly distributed input code including a most significant code (MSC) and a least significant code (LSC); cause the switching network to transfer a first charge from the set of capacitors to the charge accumulator based on the MSC; and cause the switching network to transfer a second charge from the set of capacitors to the charge accumulator based on the LSC, where each capacitor of the set of capacitors is used for each value of the non-uniformly distributed input code, each capacitor of the set of capacitors is configured to provide a same corresponding nominal charge within each value of the non-uniformly distributed input code, where the same nominal charge is proportional to the value of the non-uniformly distributed input code, for a non-zero LSC, the controller is configured to cause the switching network and the set of capacitors to form the second charge using a plurality of subsets of the set of capacitors and a corresponding plurality of pairs of reference voltages, where each pair of the plurality of pairs of reference voltages share one common reference voltage with an adjacent pair of the plurality of pairs of reference voltages, each of the plurality of subsets of the capacitors is different from one another, and each of the plurality of pairs of reference voltages is different from one another, and a sum of the first transferred charge and the second transferred charge provides a uniformly distributed output value in accordance with the uniformly distributed input code.

Example 8. The DAC of example 7, where the charge accumulator includes an integrator.

Example 9. The DAC of one of examples 7 or 8, where the controller is configured to cause the switching network to transfer the first charge and the second charge during different time periods.

Example 10. The DAC of one of examples 7 to 9, where the controller is configured to: cause the switching network to transfer the first charge from the set of capacitors to the charge accumulator based on the MSC during a first time period; and cause the switching network to transfer the second charge from the set of capacitors to the charge accumulator based on the LSC during a second time period.

Example 11. The DAC of example 10, further including a further set of capacitors, where: the further set of capacitors has a same number of capacitors as the set of capacitors, and each capacitor of the further set of capacitors has a same capacitance as each capacitor of the set of capacitors; and the controller is further configured to: cause the switching network to transfer a further second charge from the further set of capacitors to the charge accumulator based on the LSC during the first time period, and cause the switching network to transfer a further first charge from the further set of capacitors to the charge accumulator based on the MSC during the second time period.

Example 12. The DAC of one of examples 7 to 11, further including a reference voltage generator coupled to the switching network, the reference voltage generator configured to provide an upper reference voltage, a lower reference voltage, and divided reference voltages having values between the lower reference voltage and the upper reference voltage.

Example 13. The DAC of example 12, where the controller is further configured to: cause the switching network to couple each capacitor of the set of capacitors to the upper reference voltage and to the lower reference voltage for a non-zero MSC; and cause the switching network to couple each capacitor of the set of capacitors to at least one divided reference voltage of the divided reference voltages for a non-zero LSC.

Example 14. The DAC of example 12 or 13, where: the set of capacitors includes four capacitors; the MSC includes a code space of −4, 0 and +4; and the LSC includes a code space of −2, −1, 0, +1 and +2.

Example 15. The DAC of example 14, where the controller is further configured to: cause the switching network to couple each capacitor of the set of capacitors to the upper reference voltage and to the lower reference voltage in response to an MSC of +4 or −4; cause the switching network, in response to an LSC of +2 or −2, to couple a first two capacitors of the set of capacitors to the lower reference voltage and a first divided reference voltage having a voltage that is substantially an average of the upper reference voltage and the lower reference voltage, and couple a second two capacitors of the set of capacitors to the first divided reference voltage and the upper reference voltage; and cause the switching network, in response to an LSC of +1 or −1, to couple a first capacitor of the set of capacitors to the lower reference voltage and a second divided reference voltage having a voltage that is substantially an average of the first divided reference voltage and the lower reference voltage, couple a second capacitor of the set of capacitors to the first divided reference voltage and the second divided reference voltage, couple a third capacitor of the set of capacitors to the first divided reference voltage and a third divided reference voltage having a voltage that is substantially an average of the first divided reference voltage and the upper reference voltage, and couple a fourth capacitor of the set of capacitors to the third divided reference voltage and the upper reference voltage.

Example 16. The DAC of example 15, where the controller is further configured to: cause the switching network to couple each capacitor to a same voltage over two consecutive phases in response to an MSC of 0 or an LSC of 0.

Example 17. A sigma-delta analog-to-digital converter (ADC) including: an integrator; a multi-bit quantizer coupled to an output of the integrator; a plurality of capacitors having first terminals coupled to an input of the integrator; a reference voltage generator including outputs configured to provide a plurality of evenly spaced reference voltages; a switching network coupled between the reference voltage generator and second terminals of the plurality of capacitors; and a controller configured to: map a uniformly distributed input code to a non-uniformly distributed input code, and successively couple the outputs of the reference voltage generator to the second terminal of each of the plurality of capacitors via the switching network according a respective value of the non-uniformly distributed input codes to apply a voltage difference, where each of the plurality of capacitors is used for each value of the non-uniformly distributed input code, the voltage difference applied to the second terminals of the plurality of capacitors is proportional to the value of the non-uniformly distributed input code, the voltage difference applied to the second terminals of the plurality of capacitors is substantially the same for each capacitor of the plurality of capacitors for a particular value of the non-uniformly distributed input code, for a non-zero LSC, the controller is configured to apply a first voltage difference formed by a first pair of outputs of the reference voltage generator to a first subset of the plurality of capacitors, and to apply a second voltage difference formed by a second pair of outputs of the reference voltage generator to a second subset of the plurality of capacitors different from the first subset, where the first pair of outputs are different from and share a common output with the with second pair of outputs.

Example 18. The sigma-delta ADC of example 17, where the non-uniformly distributed input code includes a most significant code (MSC) and a least significant code (LSC); a third voltage difference based on a maximum voltage and a minimum voltage produced by the reference voltage generator is applied to the second terminals of each of the plurality of capacitors for a non-zero MSC; and at least one divided voltage produced by the reference voltage generator is applied to the second terminals of each of the plurality of capacitors for a zero MSC or for a zero LSC.

Example 19. The sigma-delta ADC of example 18, where: the integrator is configured to accumulate charge transferred from the plurality of capacitors over a plurality of cycles based on the MSC and the LSC; and the accumulated charge is proportional to a value of the uniformly distributed input code.

Example 20. The sigma-delta ADC of example 18 or 19, where: a first half of the plurality of capacitors is used to convert the MSC during a first time period; a second half of the plurality of capacitors is used to convert the LSC during the first time period, where the first half of the plurality of capacitors has a same number of capacitors as the second half of the plurality of capacitors.

Example 21. The sigma-delta ADC of one of examples 17 to 20, where the sigma-delta ADC includes a discrete-time modulator or a continuous-time modulator.

Example 22. The sigma-delta ADC of one of examples 17 to 21, where: the plurality of capacitors includes four capacitors; the multi-bit quantizer is configured to provide 13 quantization levels; and the controller is configured to map each of the 13 quantization levels to a corresponding value of the non-uniformly distributed input code.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for digital-to-analog conversion, the method comprising:

mapping a uniformly distributed input code to a non-uniformly distributed input code of a switched capacitor digital-to-analog converter (DAC), the non-uniformly distributed input code comprising a most significant code (MSC) and a least significant code (LSC);

transferring a first charge from a set of DAC capacitors to a charge accumulator based on the MSC;

forming a second charge based on the LSC; and transferring the second charge from the set of DAC capacitors to the charge accumulator, wherein each capacitor of the set of DAC capacitors is used for each value of the non-uniformly distributed input code, each capacitor of the set of DAC capacitors provides a same corresponding nominal charge within each value of the non-uniformly distributed input code, wherein the same nominal charge is proportional to a value of the non-uniformly distributed input code, for a non-zero LSC, the second charge is formed using a plurality of subsets of the set of DAC capacitors and a corresponding plurality of pairs of reference voltages, wherein each pair of the plurality of pairs of reference voltages share one common reference voltage with an adjacent pair of the plurality of pairs of reference voltages, each of the plurality of subsets of the DAC capacitors is different from one another, and each of the plurality of pairs of reference voltages is different from one another, and a sum of the first transferred charge and the second transferred charge provides a uniformly distributed output value in accordance with the uniformly distributed input code.

2. The method of claim 1, wherein:
the non-uniformly distributed input code further comprises an intermediate significant code (ISC); and
the method comprises transferring a third charge from the set of DAC capacitors to the charge accumulator based on the ISC.

3. The method of claim 1, wherein transferring the first charge is performed during a different time period from transferring the second charge.

4. The method of claim 1, further comprising:
transferring the first charge using the set of DAC capacitors during a first time period;
transferring a further second charge using a further set of DAC capacitors during the first time period, wherein the further set of DAC capacitors has a same number of capacitors as the set of DAC capacitors, and each capacitor of the further set of DAC capacitors has a same capacitance as each capacitor as the set of DAC capacitors;
transferring the second charge using the set of capacitors during a second time period; and
transferring a further first charge during the second time period using the further set of DAC capacitors.

5. The method of claim 1, wherein:
transferring the first charge from the set of DAC capacitors to the charge accumulator based on the MSC comprises, for a non-zero MSC:
coupling a first voltage to a first plate of each capacitor of the set of DAC capacitors followed by coupling a second voltage to the first plate of each capacitor of the set of DAC capacitors, wherein the first and second voltages are provided respectively by a first reference voltage node and a second reference voltage node; and
transferring the second charge from the set of DAC capacitors to the charge accumulator based on the LSC comprises, for a non-zero LSC:
coupling a third voltage to the first plate of a subset of the set of DAC capacitors followed by coupling a fourth voltage to the first plate of the subset of the set of DAC capacitors, wherein at least one of the third voltage or the fourth voltage is provided by a reference voltage node having a voltage between the first voltage and the second voltage.

6. The method of claim 1, wherein:
the MSC comprises code values of +4, 0 and −4;
the LSC comprises code values of +2, +1, 0, −1, −2; and
mapping the uniformly distributed input code to the non-uniformly distributed input code comprises:
mapping an input code of +6 to an MSC of +4 and an LSC of +2,
mapping an input code of +5 to an MSC of +4 and an LSC of +1,
mapping an input code of +4 to an MSC of +4 and an LSC of 0,
mapping an input code of +3 to an MSC of +4 and an LSC of −1,
mapping an input code of +2 to an MSC of +0 and an LSC of +2 or to an MSC of +4 and an LSC of −2,
mapping an input code of +1 to an MSC of 0 and an LSC of +1,
mapping an input code of 0 to an MSC of 0 and an LSC of 0,
mapping an input code of −1 to an MSC of 0 and an LSC of −1,
mapping an input code of −2 to an MSC of 0 and an LSC of −2 or to an MSC of −4 and an LSC of +2,
mapping an input code of −3 to an MSC of −4 and an LSC of +1,
mapping an input code of −4 to an MSC of −4 and an LSC of 0,
mapping an input code of −5 to an MSC of −4 and an LSC of −1, and
mapping an input code of −6 to an MSC of −4 and an LSC of −2.

7. A digital-to-analog converter (DAC) comprising:
a set of capacitors;
a charge accumulator coupled to the set of capacitors;
a switching network coupled between the set of capacitors and a plurality of reference voltage nodes;
a controller coupled to the switching network, the controller configured to:
map a uniformly distributed input code to a non-uniformly distributed input code, the non-uniformly distributed input code comprising a most significant code (MSC) and a least significant code (LSC);
cause the switching network to transfer a first charge from the set of capacitors to the charge accumulator based on the MSC; and
cause the switching network to transfer a second charge from the set of capacitors to the charge accumulator based on the LSC, wherein
each capacitor of the set of capacitors is used for each value of the non-uniformly distributed input code,
each capacitor of the set of capacitors is configured to provide a same corresponding nominal charge within each value of the non-uniformly distributed input code, wherein the same nominal charge is proportional to the value of the non-uniformly distributed input code,
for a non-zero LSC, the controller is configured to cause the switching network and the set of capacitors to form the second charge using a plurality of subsets of the set of capacitors and a corresponding plurality of pairs of reference voltages, wherein each pair of the plurality of pairs of reference voltages share one common reference voltage with an adjacent pair of the plurality of pairs of reference voltages, each of the plurality of subsets of the capacitors is different from one another, and each of the plurality of pairs of reference voltages is different from one another, and
a sum of the first transferred charge and the second transferred charge provides a uniformly distributed output value in accordance with the uniformly distributed input code.

8. The DAC of claim 7, wherein the charge accumulator comprises an integrator.

9. The DAC of claim 7, wherein the controller is configured to cause the switching network to transfer the first charge and the second charge during different time periods.

10. The DAC of claim 7, wherein the controller is configured to:
cause the switching network to transfer the first charge from the set of capacitors to the charge accumulator based on the MSC during a first time period; and
cause the switching network to transfer the second charge from the set of capacitors to the charge accumulator based on the LSC during a second time period.

11. The DAC of claim 10, further comprising a further set of capacitors, wherein:
the further set of capacitors has a same number of capacitors as the set of capacitors, and each capacitor of the further set of capacitors has a same capacitance as each capacitor of the set of capacitors; and
the controller is further configured to:
cause the switching network to transfer a further second charge from the further set of capacitors to the charge accumulator based on the LSC during the first time period, and
cause the switching network to transfer a further first charge from the further set of capacitors to the charge accumulator based on the MSC during the second time period.

12. The DAC of claim 7, further comprising a reference voltage generator coupled to the switching network, the reference voltage generator configured to provide an upper reference voltage, a lower reference voltage, and divided reference voltages having values between the lower reference voltage and the upper reference voltage.

13. The DAC of claim 12, wherein the controller is further configured to:
cause the switching network to couple each capacitor of the set of capacitors to the upper reference voltage and to the lower reference voltage for a non-zero MSC; and
cause the switching network to couple each capacitor of the set of capacitors to at least one divided reference voltage of the divided reference voltages for a non-zero LSC.

14. The DAC of claim 12, wherein:
the set of capacitors includes four capacitors;
the MSC comprises a code space of −4, 0 and +4; and
the LSC comprises a code space of −2, −1, 0, +1 and +2.

15. The DAC of claim 14, wherein the controller is further configured to:
cause the switching network to couple each capacitor of the set of capacitors to the upper reference voltage and to the lower reference voltage in response to an MSC of +4 or −4;
cause the switching network, in response to an LSC of +2 or −2, to couple a first two capacitors of the set of capacitors to the lower reference voltage and a first divided reference voltage having a voltage that is substantially an average of the upper reference voltage and the lower reference voltage, and couple a second two capacitors of the set of capacitors to the first divided reference voltage and the upper reference voltage; and
cause the switching network, in response to an LSC of +1 or −1, to
couple a first capacitor of the set of capacitors to the lower reference voltage and a second divided reference voltage having a voltage that is substantially an average of the first divided reference voltage and the lower reference voltage,
couple a second capacitor of the set of capacitors to the first divided reference voltage and the second divided reference voltage,
couple a third capacitor of the set of capacitors to the first divided reference voltage and a third divided reference voltage having a voltage that is substantially an average of the first divided reference voltage and the upper reference voltage, and
couple a fourth capacitor of the set of capacitors to the third divided reference voltage and the upper reference voltage.

16. The DAC of claim 15, wherein the controller is further configured to:
cause the switching network to couple each capacitor to a same voltage over two consecutive phases in response to an MSC of 0 or an LSC of 0.

17. A sigma-delta analog-to-digital converter (ADC) comprising:
an integrator;
a multi-bit quantizer coupled to an output of the integrator;
a plurality of capacitors having first terminals coupled to an input of the integrator;
a reference voltage generator comprising outputs configured to provide a plurality of evenly spaced reference voltages;
a switching network coupled between the reference voltage generator and second terminals of the plurality of capacitors; and
a controller configured to:
map a uniformly distributed input code to a non-uniformly distributed input code, and
successively couple the outputs of the reference voltage generator to the second terminal of each of the plurality of capacitors via the switching network according to a respective value of the non-uniformly distributed input codes to apply a voltage difference, wherein
each of the plurality of capacitors is used for each value of the non-uniformly distributed input code,
the voltage difference applied to the second terminals of the plurality of capacitors is proportional to the value of the non-uniformly distributed input code,
the voltage difference applied to the second terminals of the plurality of capacitors is substantially the same for each capacitor of the plurality of capacitors for a particular value of the non-uniformly distributed input code,
for a non-zero LSC, the controller is configured to apply a first voltage difference formed by a first pair of outputs of the reference voltage generator to a first subset of the plurality of capacitors, and to apply a second voltage difference formed by a second pair of outputs of the reference voltage generator to a second subset of the plurality of capacitors different from the first subset, wherein the first pair of outputs are different from and share a common output with the with second pair of outputs.

18. The sigma-delta ADC of claim 17, wherein:
the non-uniformly distributed input code comprises a most significant code (MSC) and a least significant code (LSC);
a third voltage difference based on a maximum voltage and a minimum voltage produced by the reference voltage generator is applied to the second terminals of each of the plurality of capacitors for a non-zero MSC; and at least one divided voltage produced by the reference voltage generator is applied to the second terminals of each of the plurality of capacitors for a zero MSC or for a zero LSC.

19. The sigma-delta ADC of claim 18, wherein:

the integrator is configured to accumulate charge transferred from the plurality of capacitors over a plurality of cycles based on the MSC and the LSC; and the accumulated charge is proportional to a value of the uniformly distributed input code.

20. The sigma-delta ADC of claim 18, wherein:

a first half of the plurality of capacitors is used to convert the MSC during a first time period;

a second half of the plurality of capacitors is used to convert the LSC during the first time period, wherein the first half of the plurality of capacitors has a same number of capacitors as the second half of the plurality of capacitors;

the first half of the plurality of capacitors is used to convert the LSC during a second time period; and the second half of the plurality of capacitors is used to convert the MSC during the second time period.

21. The sigma-delta ADC of claim 17, wherein the sigma-delta ADC comprises a discrete-time modulator or a continuous-time modulator.

22. The sigma-delta ADC of claim 17, wherein:

the plurality of capacitors comprises four capacitors;

the multi-bit quantizer is configured to provide 13 quantization levels; and the controller is configured to map each of the 13 quantization levels to a corresponding value of the non-uniformly distributed input code.

* * * * *